US012625162B2

(12) United States Patent
Yeh et al.

(10) Patent No.: US 12,625,162 B2
(45) Date of Patent: May 12, 2026

(54) TEST SOCKET

(71) Applicant: WinWay Technology Co., Ltd.,
Kaohsiung City (TW)

(72) Inventors: Po-Han Yeh, Kaohsiung City (TW);
Chia-Pin Sun, Kaohsiung City (TW)

(73) Assignee: WinWay Technology Co., Ltd.,
Kaohsiung City (TW)

( * ) Notice: Subject to any disclaimer, the term of this
patent is extended or adjusted under 35
U.S.C. 154(b) by 134 days.

(21) Appl. No.: 18/443,246

(22) Filed: Feb. 15, 2024

(65) Prior Publication Data

US 2024/0319227 A1 Sep. 26, 2024

Related U.S. Application Data

(60) Provisional application No. 63/507,337, filed on Jun.
9, 2023.

(30) Foreign Application Priority Data

Jul. 28, 2023 (TW) ................................. 112128446

(51) Int. Cl.
*G01R 1/04* (2006.01)
(52) U.S. Cl.
CPC .................................. *G01R 1/0466* (2013.01)
(58) Field of Classification Search
CPC G01R 1/067; G01R 31/2874; G01R 31/2877;
G01R 31/2886; G01R 31/2889; G01R
31/2863; G01R 31/2896

(Continued)

(56) References Cited

U.S. PATENT DOCUMENTS

| | | | | |
|---|---|---|---|---|
| 6,489,790 B1 * | 12/2002 | An | .......................... | G01R 1/073 |
| | | | | 324/754.14 |
| 6,515,497 B1 * | 2/2003 | Matsuzawa | ........ | G01R 31/2808 |
| | | | | 324/754.15 |

(Continued)

FOREIGN PATENT DOCUMENTS

| | | |
|---|---|---|
| CN | 216117715 U | 3/2022 |
| JP | S63-148575 A | 6/1988 |

(Continued)

OTHER PUBLICATIONS

Office action for Japanese Patent Application No. 2024-012986,
dated Feb. 4, 2025.

(Continued)

*Primary Examiner* — Roberto Velez
(74) *Attorney, Agent, or Firm* — Wegman Hessler

(57) ABSTRACT

A test socket is provided and includes a base with a first
surface, a second surface opposing the first surface and
through holes, a conductive elastic sheet located on the first
surface, and a plurality of elastic metal members with first
contact ends facing toward the conductive elastic sheet. The
first contact ends include bumps suitable for inserting into
the conductive elastic sheet, and each elastic metal member
may be prevented from being contaminated by covering the
base with the conductive elastic sheet. When the elastic
metal members are pressured to insert the bumps into the
conductive elastic sheet, a low resistance better than the
resistance of the elastic metal members without squeezing
can be obtained. When the bumps are inserted into the
conductive elastic sheet, the surface of the bumps can be
cleaned and the elastic metal members are stably in contact
with the conductive elastic sheet.

46 Claims, 20 Drawing Sheets

(58) Field of Classification Search
USPC ............ 324/754.09, 754.18, 755.08, 756.02, 324/750.02, 750.03
See application file for complete search history.

(56) References Cited

U.S. PATENT DOCUMENTS

| | | | |
|---|---|---|---|
| 7,518,388 B2 | 4/2009 | Tashiro et al. | |
| 2005/0009184 A1 | 1/2005 | Maitland | |
| 2015/0377923 A1* | 12/2015 | Lee ...................... | G01R 1/0416 |
| | | | 324/756.02 |
| 2019/0204379 A1* | 7/2019 | Chen ................... | G01R 1/07371 |
| 2023/0176114 A1 | 6/2023 | Wu | |
| 2023/0288474 A1* | 9/2023 | Kim ................... | G01R 31/2896 |

FOREIGN PATENT DOCUMENTS

| | | | |
|---|---|---|---|
| JP | 2001-066341 A | 3/2001 | |
| JP | 2003-084047 A | 3/2003 | |
| JP | 2005-019343 A | 1/2005 | |
| JP | 2008-096270 A | 4/2008 | |
| JP | 2009-139298 A | 6/2009 | |
| JP | 2018-004322 A | 1/2018 | |
| JP | 2018-197702 A | 12/2018 | |
| JP | 2020-521986 A | 7/2020 | |
| TW | 201530166 A | 8/2015 | |
| TW | 556016 U | 2/2018 | |
| TW | 201837486 A | 10/2018 | |
| TW | I790605 B | 1/2023 | |
| TW | I837697 B | 4/2024 | |
| WO | 2008/123608 A1 | 10/2008 | |
| WO | 2020/149104 A1 | 7/2020 | |

OTHER PUBLICATIONS

Office action for Taiwan Patent Application No. 11212128446, dated Nov. 17, 2023.
Office action for Taiwan Patent Application No. 112137138, dated Nov. 20, 2023.

* cited by examiner

TEST SOCKET

BACKGROUND

1. Technical Field

The present disclosure relates to the semiconductor testing technology, and more particularly, to a test socket.

2. Description of Related Art

In semiconductor packaging testing, a test socket with a plurality of probes is usually used for placing a device under test such as a semiconductor package or chip, and then each probe is electrically connected to the semiconductor package or chip, so that the test signal is transmitted to the semiconductor package or chip through each probe to achieve the purpose of testing.

As the test conditions become increasingly stringent, the requirements for signal quality during the test process are getting higher and higher. Therefore, the transmission path between the probe and the device under test plays a very important role in the test interface. As such, how to shorten the transmission path or improving the contact between contact interfaces has become one of the issues to be solved in the industry.

As shown in FIG. 1, a schematic diagram of a conventional test socket for testing a device under test. In FIG. 1, a test socket 100 comprises a base 101 with a plurality of conductive through holes 102 and a probe 103 disposed in each of the conductive through holes 102, wherein the test socket 100 is disposed on a testing apparatus 104 to receive test signals from the testing apparatus 104, wherein the testing apparatus 104 can be, for example, a printed circuit board (PCB). During the test, a device under test (DUT) 9 with a plurality of conductive blocks 91 (such as solder balls) is placed on the base 101, and force is applied downward to the DUT 9, so that the conductive blocks 91 of the DUT 9 are in direct electrical contact with probe tips of the probes 103, and the test signal can be transmitted to the DUT 9 through each of the probes 103 and each of the conductive blocks 91, so that the DUT 9 can be tested.

However, during the test process, each of the probe tips of the probes 103 is often a spherical or needle-shaped structure, and the probes 103 of the test socket 100 and the conductive blocks 91 of the DUT 9 are both made with solid hard metal, so the probe tips and the conductive blocks 91 are connected in a point contact manner. Therefore, there are problems of poor contact and poor stability between the probe tips and the conductive blocks 91 that will lead to a higher contact resistance at the interface (i.e., the places where the probe tips and the conductive blocks 91 being contacted). As the contact resistance increases, a serious electro-thermal effect will occur when the current of the test signal passes through the contacts between the probe tips and the conductive blocks 91, and the high temperature generated by the electro-thermal effect will affect the elastic force of the probes 103, thereby decreasing the elastic force of the probes 103. After that, the contact between the probes 103 and the DUT 9 will become worse due to being unstable, and eventually triggering a series of vicious cycles. In addition, since the probe tip of the conventional probe 103 is driven by the elastic force of an internal spring to push against the conductive block 91 of the DUT 9 when under testing, the probe tip is wearing and generates metal debris. The metal debris may cause the probe tip to become contaminated and the aforementioned contact resistance to increase, and may even cause a short circuit between the conductive blocks 91 or the probe tips and damage the DUT 9. Therefore, special cleaning procedure must be executed frequently to clean the probe tips to avoid the various adverse reactions mentioned above. Also, when the probe 103 is damaged due to the wear of the probe tip, the unusable probe 103 must be replaced. However, there are many probes 103 in the test socket 100, so it is quite difficult, time-consuming and very inconvenient to find the damaged one among many probes 103.

In view of the above problems, how to provide a test socket that can provide good contact stability between the probes and the device under test, and at the same time effectively reduce the contact resistance and avoid the subsequent electro-thermal effect, has become a current goal that people in this technical field are eager to pursue.

SUMMARY

In view of the aforementioned shortcomings of the prior art, the present disclosure provides a test socket, which comprises: a base having a first surface, a second surface opposing the first surface, and a plurality of through holes connecting the first surface and the second surface; a conductive elastic sheet located above the first surface of the base; and a plurality of elastic metal members respectively disposed in the plurality of through holes, wherein each of the elastic metal members has a first contact end facing the conductive elastic sheet, and the first contact end comprises a bump suitable for inserting in the conductive elastic sheet.

In one embodiment, the bump of each of the elastic metal members is suitable for stabbing into a surface of the conductive elastic sheet so as to be inserted into an interior of the conductive elastic sheet.

In one embodiment, the bump of each of the elastic metal members is in plural and pointed.

In another embodiment, the bump of each of the elastic metal members is pressed against the conductive elastic sheet and inserted into the conductive elastic sheet, such that the conductive elastic sheet covers the bump.

In another embodiment, each of the elastic metal members is a spring probe, a verticalprobe, or a micro-electro-mechanical probe.

In another embodiment, the conductive elastic sheet is disposed on a frame base of the base and spaced an interval distance apart from the bump of each of the elastic metal members.

In another embodiment, a length of the bump is greater than or equal to 0.01 millimeters (mm) and less than a thickness of the conductive elastic sheet.

In another embodiment, each of the elastic metal members further comprises an elastomer disposed in each of the through holes, a metal block rotatably disposed on the elastomer and for connecting to the first contact end, and a second contact end connected to the metal block and extending towards the second surface.

In another embodiment, the base is a metal base body, and the conductive elastic sheet comprises a plurality of conductive elastic regions corresponding to the elastic metal members respectively and a plurality of conductive particles distributed in each of the conductive elastic regions, wherein a width of each of the conductive elastic regions is larger than a diameter of each of the through holes, such that each of the conductive elastic regions is in contact with the base.

In another embodiment, a thickness of the conductive elastic sheet is greater than or equal to 0.15 mm and less than or equal to 2 mm.

In another embodiment, a thickness of the conductive elastic sheet is greater than or equal to 0.15 mm and less than or equal to 0.4 mm.

In another embodiment, the conductive elastic sheet comprises a substrate and a plurality of conductive particles distributed in the substrate.

In another embodiment, a particle diameter of each of the conductive particles is greater than or equal to 0.005 mm and less than or equal to 0.1 mm.

In another embodiment, a proportion of the plurality of conductive particles to the conductive elastic sheet is greater than or equal to 30% and less than or equal to 90%.

In another embodiment, the present disclosure further comprises another conductive elastic sheet located below the second surface of the base.

In another embodiment, the conductive elastic sheet has a first contact surface and a second contact surface opposing the first contact surface, wherein the conductive elastic sheet is disposed on the base with the first contact surface facing the first surface, and the second contact surface corresponding to each of the elastic metal members has a plurality of convex pads protruding from the second contact surface.

In another embodiment, the conductive elastic sheet covers the first surface of the base and seals each of the through holes.

In another embodiment, the base further comprises a frame body disposed on a peripheral side of the conductive elastic sheet and having a fluid inlet and a fluid outlet, wherein the conductive elastic sheet is disposed on the first surface of the base, and the frame body and upper side surface of the conductive elastic sheet define a fluid space in communication with the fluid inlet and the fluid outlet.

In another embodiment, the conductive elastic sheet comprises a substrate with a plurality of conductive elastic regions and a plurality of conductive particles distributed in each of the conductive elastic regions, and at least one of the conductive elastic regions corresponds to at least two of the elastic metal members.

In another embodiment, the present disclosure further comprises a conductive member, wherein the conductive elastic sheet comprises a substrate with a plurality of conductive elastic regions corresponding to the elastic metal members respectively and a plurality of conductive particles distributed in each of the conductive elastic regions, wherein at least two of the conductive elastic regions are electrically connected by the conductive member.

In another embodiment, the elastic metal member is a ground probe or a power probe.

In another embodiment, the conductive elastic sheet is disposed with a support body on a peripheral side thereof, and the conductive elastic sheet is disposed on the base by the support body, so that there is a gap between the conductive elastic sheet and the first surface or the second surface, such that both ends of each of the elastic metal members are respectively protruded from the first surface and the second surface of the base and in contact with the conductive elastic sheet.

In yet another embodiment, when the bump of each of the elastic metal members stabs into a lower surface of the conductive elastic sheet and is inserted in the conductive elastic sheet, a distance between a top end of the bump and an upper surface of the conductive elastic sheet is less than 0.35 mm, or a proportion of the distance between the top end of the bump and the upper surface of the conductive elastic sheet to a thickness of the conductive elastic sheet is less than 85%.

The present disclosure further discloses a test socket, which comprises: a base having a first surface, a second surface opposing the first surface, and a plurality of through holes connecting the first surface and the second surface; a plurality of elastic metal members respectively disposed in the plurality of through holes; and a conductive elastic sheet located above the base and the plurality of elastic metal members and having a thickness of less than or equal to 2 mm.

In one embodiment, the thickness of the conductive elastic sheet is less than or equal to 0.4 mm.

In another embodiment, each of the elastic metal members has a first contact end facing the conductive elastic sheet, wherein the first contact end comprises a bump suitable for stabbing into a surface of the conductive elastic sheet, and the bump is able to insert into an interior of the conductive elastic sheet.

In another embodiment, the bump is in plural and pointed.

In another embodiment, a length of the bump is greater than or equal to 0.01 mm and less than the thickness of the conductive elastic sheet.

In another embodiment, the base is a metal base body, and the conductive elastic sheet comprises a plurality of conductive elastic regions corresponding to the elastic metal members respectively and a plurality of conductive particles distributed in each of the conductive elastic regions, wherein a width of each of the conductive elastic regions is larger than a diameter of each of the through holes, such that each of the conductive elastic regions is in contact with the base.

In another embodiment, the thickness of the conductive elastic sheet is greater than or equal to 0.15 mm and less than or equal to 0.4 mm.

In another embodiment, the conductive elastic sheet comprises a substrate and a plurality of conductive particles distributed in the substrate.

In another embodiment, the base further comprises a frame body disposed on a peripheral side of the conductive elastic sheet and having a fluid inlet and a fluid outlet, wherein the conductive elastic sheet is disposed on the first surface of the base and seals each of the through holes, and the frame body and upper side surface of the conductive elastic sheet define a fluid space in communication with the fluid inlet and the fluid outlet.

In another embodiment, the present disclosure further comprises a conductive member, wherein the conductive elastic sheet comprises a substrate with a plurality of conductive elastic regions corresponding to the elastic metal members respectively and a plurality of conductive particles distributed in each of the conductive elastic regions, wherein at least two of the conductive elastic regions are electrically connected by the conductive member.

The present disclosure further discloses a test socket, which comprises: a base; a conductive elastic sheet located on the base; and a plurality of elastic metal members disposed in the base, wherein a contact resistance between the elastic metal members and the conductive elastic sheet when the elastic metal members are inserted in the conductive elastic sheet is smaller than a contact resistance when the elastic metal members directly contact on conductive blocks of a device under test.

In another embodiment, the base comprises a first surface, a second surface opposing the first surface, and a plurality of through holes connecting the first surface and the second surface, wherein the first surface is used for disposing the conductive elastic sheet, and each of the through holes is used for disposing each of the elastic metal members.

In another embodiment, each of the elastic metal members has a first contact end facing the conductive elastic sheet, and the first contact end comprises a bump suitable for inserting in the conductive elastic sheet.

In another embodiment, the bump of each of the elastic metal members is suitable for stabbing into a surface of the conductive elastic sheet so as to be inserted into an interior of the conductive elastic sheet.

In another embodiment, the bump of each of the elastic metal members is in plural and pointed.

In another embodiment, a length of the bump is greater than or equal to 0.01 mm and less than a thickness of the conductive elastic sheet.

In another embodiment, the conductive elastic sheet comprises a substrate and a plurality of conductive particles distributed in the substrate.

In another embodiment, the base further comprises a frame body disposed on a peripheral side of the conductive elastic sheet and having a fluid inlet and a fluid outlet, wherein the conductive elastic sheet is disposed on the first surface of the base and seals each of the through holes, and the frame body and upper side surface of the conductive elastic sheet define a fluid space in communication with the fluid inlet and the fluid outlet.

In yet another embodiment, a thickness of the conductive elastic sheet is less than or equal to 0.4 mm.

The present disclosure further discloses a test socket, which comprising: a metal base having a first surface and a second surface opposing the first surface and a plurality of through holes communicating the first surface and the second surface; a plurality of elastic metal members disposed in the plurality of through holes respectively and forming a coaxial structure with the metal base; and a conductive elastic sheet located over the first surface of the metal base and suitable for contacting the elastic metal member.

In another embodiment, the elastic metal member has a bump suitable for stabbing into a surface of the conductive elastic sheet so as to be inserted into an interior of the conductive elastic sheet.

In another embodiment, the conductive elastic sheet is disposed on a frame base of the metal base and spaced an interval distance apart from the bumps of the elastic metal members.

In another embodiment, the elastic metal member is a ground probe and is connected to the metal base.

In another embodiment, the present disclosure further comprises a conductive member, wherein the conductive elastic sheet comprises a substrate with a plurality of conductive elastic regions corresponding to the elastic metal members respectively and a plurality of conductive particles distributed in the conductive elastic region, wherein at least two of the conductive elastic regions are electrically connected by the conductive member.

In another embodiment, a width of the conductive elastic region is larger than a diameter of the through hole, such that the conductive elastic region is in contact with the metal base.

In another embodiment, the present disclosure further comprising a conductive member, wherein the conductive elastic sheet comprises a substrate with a plurality of conductive elastic regions corresponding to the elastic metal members respectively and a plurality of conductive particles distributed in the conductive elastic region, wherein at least two of the conductive elastic regions are electrically connected by the conductive member.

In another embodiment, the present disclosure further comprising another conductive elastic sheet located below the second surface of the metal base.

In another embodiment, sidewall of the through hole is a continuous surface, and the continuous surface substantively has a constant distance from side surface of the elastic metal member disposed in the through hole.

As can be understood from the above, in the test socket of the present disclosure, the bump of the first contact end of each of the elastic metal members is inserted into the conductive elastic sheet, thereby increasing the contact area between the first contact end and the conductive elastic sheet to achieve the purpose of reducing the contact resistance, and when the bump is covered with the conductive elastic sheet, each of the elastic metal members is not prone to shaking, so they have the effect of stable contact; furthermore, since the bump can directly contact with each of the conductive particles when stabbing into the conductive elastic sheet, the resistance can be quickly reduced and the surface of the first contact end can be cleaned; in addition, the conductive elastic sheet seals each of the through holes to prevent debris from entering the through holes and contaminating the elastic metal members.

BRIEF DESCRIPTION OF THE DRAWINGS

FIG. 21A to FIG. 21B are run charts respectively showing the elastic force and temperature change of the probe of the conventional test socket and the elastic metal member of the test socket of the present disclosure when a current of 6 ampere is passed through.

FIG. 22A to FIG. 22C are run charts respectively showing the elastic force and temperature change of the old and new probes of the conventional test socket and the used elastic metal member of the test socket of the present disclosure when a current of 3 ampere is passed through.

DETAILED DESCRIPTION

Implementations of the present disclosure are described below by embodiments. Other advantages and technical effects of the present disclosure can be readily understood by one of ordinary skill in the art upon reading the disclosure of this specification. However, the present disclosure can also be implemented or applied through other different specific implementation forms.

Figure 2:
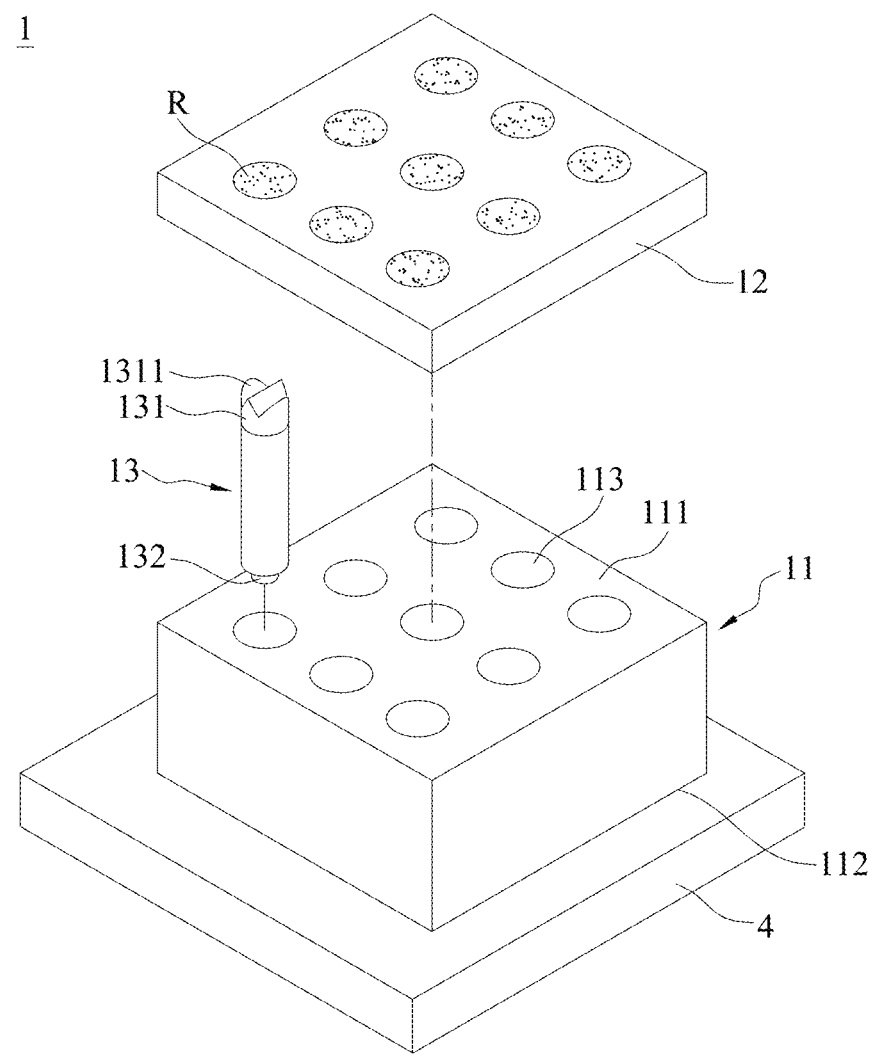
FIG. 2 is an exploded perspective view of a test socket of the present disclosure.
Figure 3:
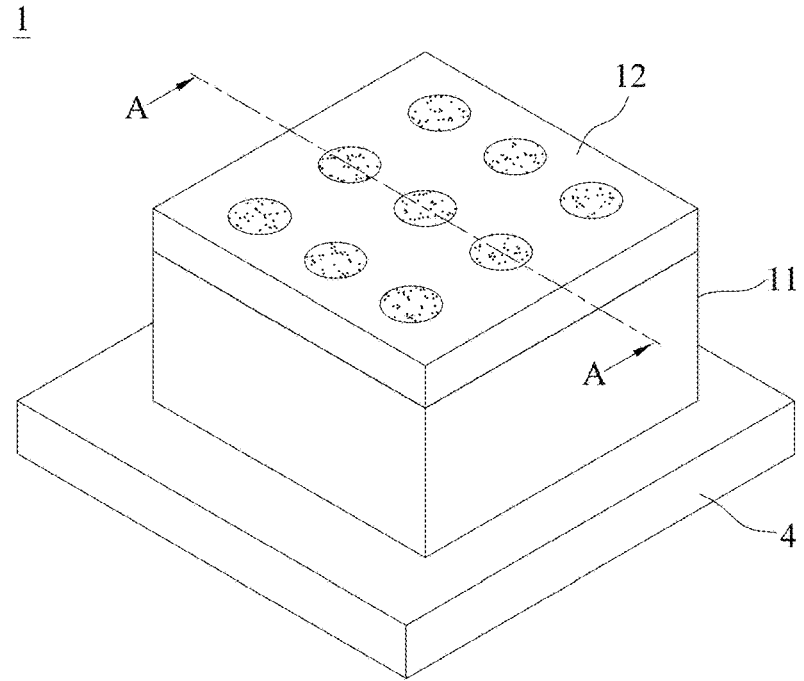
FIG. 3 is a three-dimensional structural view of the test socket of the present disclosure.
Figure 4:
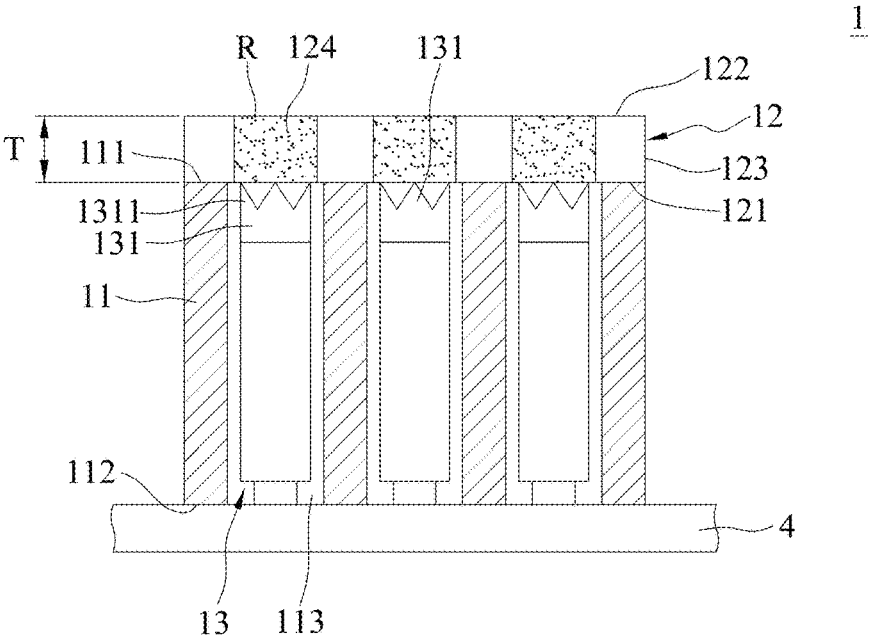
FIG. 4 is a cross-sectional view along a line A-A in FIG. 3.

FIG. 2 is an exploded perspective view of a test socket of the present disclosure, FIG. 3 is a three-dimensional structural view of the test socket of the present disclosure, FIG. 4 is a cross-sectional view along a line A-A in FIG. 3. As shown in FIG. 2 to FIG. 4, a test socket 1 of the present disclosure comprises a base 11, a conductive elastic sheet 12 located above the base 11, and a plurality of elastic metal members 13 extending toward the conductive elastic sheet 12 and disposed in the base 11. In one embodiment, the test socket 1 of the present disclosure can be a probe socket or a probe card and can be disposed on a testing device 4, so that each of the elastic metal members 13 receives a test signal from the testing device 4, wherein the elastic metal member 13 can be a spring probe. Detailed description of the test socket 1 of the present disclosure is as follows.

Figure 5:
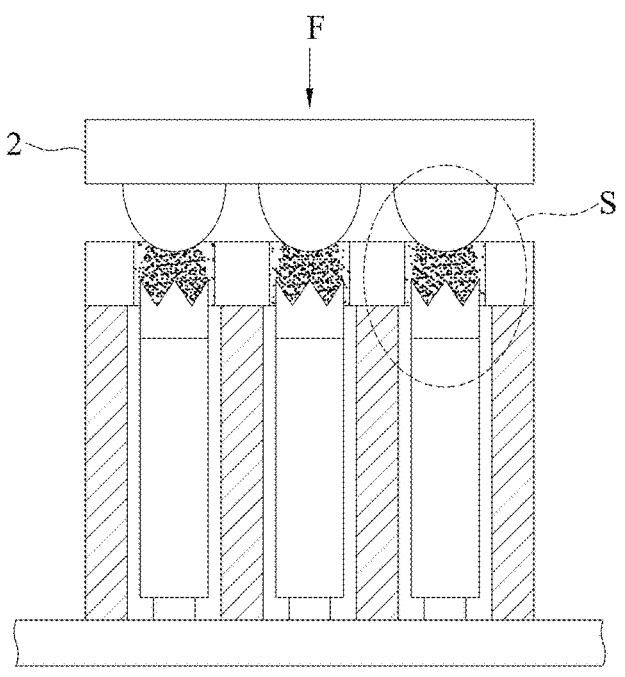
FIG. 5 is a test schematic diagram illustrating a device under test being placed on the test socket of the present disclosure.

The base 11 is a base body for placing a device under test (DUT) 2 (e.g., as shown in FIG. 5). Specifically, the base 11 comprises a first surface 111, a second surface 112 opposing the first surface 111, and a plurality of through holes 113 connecting the first surface 111 and the second surface 112, wherein the base 11 is disposed on the testing device 4 providing test signals via the second surface 112. Furthermore, the DUT 2 such as a semiconductor package, a chip, or a wafer can be disposed above the first surface 111 of the base 11. In one embodiment, the base 11 is formed with a sidewall in a direction from a peripheral side of the first surface 111 extending toward the second surface 112 (as shown in the bottom of FIG. 2). In addition, the base 11 can be a base body made of metal material. In an embodiment, the base 11 can be a coaxial test base used for high-frequency testing.

The conductive elastic sheet 12 can be a thin sheet with excellent mechanical properties (such as ductility and toughness), and the conductive elastic sheet 12 is located on the first surface 111 of the base 11. Specifically, the conductive elastic sheet 12 comprises a first contact surface 121 and a second contact surface 122 opposing the first contact surface 121, and the conductive elastic sheet 12 can be a soft sheet structure made of a conductive medium, wherein when the conductive medium is pressured, a conductive path can be formed along the pressured direction, so that the circuit is connected from top and bottom for testing purposes. In addition, the conductive elastic sheet 12 can be attached onto the first surface 111, that is, the conductive elastic sheet 12 can cover the first surface 111 of the base 11 to seal each of the through holes 113, thereby preventing metal debris, dust, or liquid from falling into each of the through holes 113, so that each of the through holes 113 and the elastic metal member 13 therein can be kept clean, and the contact between the elastic metal member 13 and oxygen can also be reduced, thus preventing the problem of metal oxidation from occurring to the elastic metal member 13.

In one embodiment, as shown in FIG. 2 to FIG. 4, the conductive elastic sheet 12 may comprise a substrate 123 defined with a plurality of conductive elastic regions R corresponding to the plurality of elastic metal members 13, and a plurality of conductive particles 124 distributed in each of the conductive elastic regions R. Accordingly, the conductive elastic sheet 12 is distributed with the conductive particles 124 in each of the conductive elastic regions R, and the regions of the non-conductive elastic regions R in the substrate 123 are without conductive particles 124, that is, the conductive elastic sheet 12 has a plurality of conductive elastic pads (e.g., conductive bump pads) formed by the conductive elastic regions R distributed with conductive particles. Therefore, a conductive path is formed in each of the conductive elastic regions R (or each of the conductive elastic pads) between the first contact surface 121 and the second contact surface 122 of the conductive elastic sheet 12, such that the phenomenon of short circuit between the conductive paths formed in adjacent conductive elastic pads can be avoided, or the problem of the current of the conductive path overflowing to another conductive path can be prevented.

Each of the elastic metal members 13 has a first contact end 131 and a second contact end 132 and is disposed in each of the through holes 113. The first contact end 131 of each of the elastic metal members 13 can be displaced in a direction toward the first surface 111 of the base 11 based on internal elastic force of the elastic metal member 13, or is displaced in a direction toward the through hole 113 by the squeezing force. In one embodiment, the elastic metal member 13 of the present disclosure can be a spring probe, a vertical probe (e.g., a cobra probe), a micro-electromechanical probe, or other elements that have elastic extension and can provide a travel for packaging and testing the DUT 2, but not limited to the above.

In particular, the first contact end 131 of each of the elastic metal members 13 faces the conductive elastic sheet 12 and comprises a bump 1311 suitable for inserting in the conductive elastic sheet 12. The present disclosure increases the contact area between the bump 1311 and the conductive elastic sheet 12 to achieve a lower contact resistance. Compared with the first contact end 131 being directly and electrically connected to the DUT 2, a better contact resistance can be provided, that is, a contact resistance between the bump 1311 and the conductive elastic sheet 12 when the bump 1311 of the elastic metal member 13 is inserted into the conductive elastic sheet 12 can be smaller than a contact resistance when the first contact end 131 directly contacts the DUT 2.

It has been experimentally verified that if the elastic metal member 13 directly contacts the DUT 2, the actual resistance thereof is about 37.7 milliohms (mΩ). In addition, if the conductive elastic sheet 12 of the test socket 1 of the present disclosure is made with a thickness of 0.2 mm, after the bump 1311 of the elastic metal member 13 is inserted into the conductive elastic sheet 12, a contact resistance thereof can be 30.4 milliohms (mΩ). It is clear that the design of the present disclosure can provide a better testing environment.

In addition, the bump 1311 of the first contact end 131 is suitable for inserting in the conductive elastic sheet 12 and comprises two types. The first type is that after the first contact end 131 pressures the conductive elastic sheet 12 with the bump 1311, the conductive elastic sheet 12 is deformed and the bump 1311 is fully or partially covered by the conductive elastic sheet 12. The second type is that the bump 1311 directly stabs the conductive elastic sheet 12 and is embedded in the conductive elastic sheet 12. More specifically, for the non-embedded type of the first type, the bump 1311 of the first contact end 131 is inserted into an internal of the conductive elastic sheet 12 by sinking into the surface of the conductive elastic sheet 12 without stabbing the surface of the conductive elastic sheet 12. That is, the conductive elastic sheet 12 covers all or part of the bump 1311, thereby increasing the contact area between the elastic metal member 13 and the conductive elastic sheet 12. In addition, for the embedded type of the second type, the stabbing of the first contact end 131 via the bump 1311 to the surface of the conductive elastic sheet 12 (the first contact surface 121 in FIG. 4) and into the internal of the conductive elastic sheet 12 can also increase the contact area between the elastic metal member 13 and the conductive elastic sheet 12.

Figure 6:
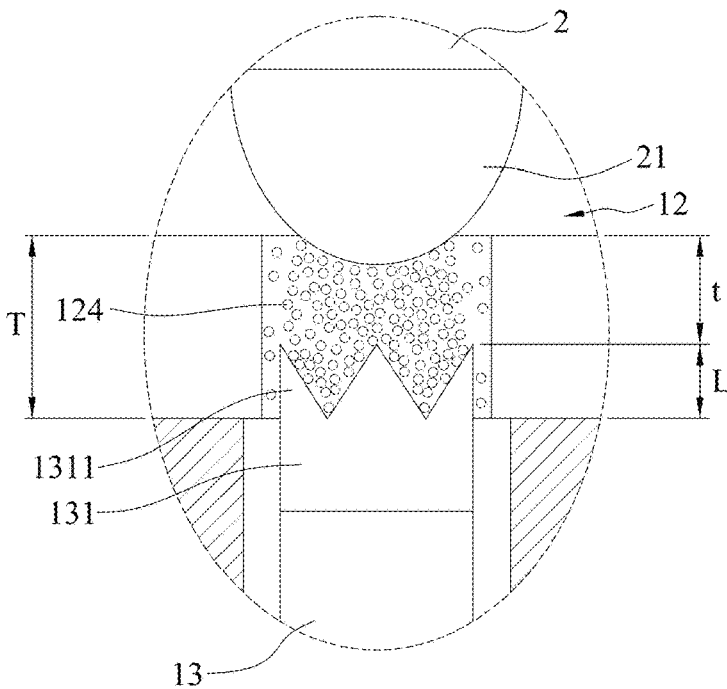
FIG. 6 is a partial enlarged view of a region S in FIG. 5.

FIG. 5 is a test schematic diagram illustrating a device under test being placed on the test socket of the present disclosure, and FIG. 6 is a partial enlarged view of a region S in FIG. 5. Please also refer to FIG. 4 in conjunction with FIG. 5 and FIG. 6. As shown in FIG. 4, when the first contact surface 121 and the second contact surface 122 of the conductive elastic sheet 12 in the conductive elastic region are not pressured, there is no electrical connection between the conductive particles 124. As shown in FIG. 5 to FIG. 6, when the DUT 2 is pressured by the force F, since the conductive elastic sheet 12 is elastic, a conductive block 21 of the DUT 2 can be sunk into the conductive elastic sheet 12, and the bump 1311 of the elastic metal member 13 can also be sunk into the conductive elastic sheet 12, wherein the conductive block 21 and the bump 1311 are pressured from top and bottom, and the distance between the conductive particles 124 in the pressured direction becomes gradually smaller and then the conductive particles 124 are in contact with each other; that is, a conductive path for electrical connection between the first contact surface 121 and the second contact surface 122 is provided in each of the conductive elastic regions R along the pressured direction. Accordingly, during the test process of the DUT 2, when the current formed by the test signal passes through the conductive path formed in each of the conductive elastic regions R, the current will not overflow to the conductive paths in other conductive elastic regions R; and even if the conductive blocks 21 of the DUT 2 are densely packed, or as the semiconductor process evolves and the DUT 2 becomes more miniaturized, the purpose of ensuring that the test signal is transmitted in its conductive path and the effect that the conductive paths do not interfere with each other can still be achieved.

In practical applications, as shown in FIG. 4 to FIG. 6, in the initial state of the test socket 1 of the present disclosure (as shown in FIG. 4), the bump 1311 of each of the elastic metal members 13 is not inserted in the conductive elastic sheet 12. That is, each of the elastic metal members 13 and the conductive elastic sheet 12 are in a state of being separated or lightly in contact with each other. Specifically, the state of contact in each other means that the elastic metal piece 13 slightly touches to the surface of the conductive elastic sheet 12 but not pressured into the conductive elastic sheet 12. During testing, the base 11 can receive test signals from the testing device 4. Specifically, after placing the DUT 2 having a plurality of conductive blocks 21 (such as solder balls) on the base 11 and the conductive elastic sheet 12, each of the conductive blocks 21 is arranged opposite to the corresponding elastic metal member 13. When the DUT 2 is pressed downward against the conductive elastic sheet 12 by the force F, the DUT 2 and each of the elastic metal members 13 press the conductive elastic pad (i.e., the conductive elastic region R distributed with conductive particles) of the conductive elastic sheet 12 from top and bottom. At this time, each of the elastic metal members 13 is inserted into the conductive elastic sheet 12 via a bump 1311, so that a conductive path (as shown in FIG. 6) is formed between the corresponding conductive block 21 and the elastic metal member 13 in the conductive elastic sheet 12. Accordingly, the corresponding conductive block 21 and the elastic metal member 13 are electrically connected via the conductive path, and the test signal is transmitted to the DUT 2 via the elastic metal member 13, the conductive elastic sheet 12 and the conductive block 21 for testing the DUT 2. Since the elastic metal member 13 is inserted into the conductive elastic sheet 12 via the bump 1311, a larger contact area can be obtained and the contact resistance can be reduced. Due to the conductive elastic sheet 12 is designed with the conductive elastic pads, mutual interference of conductive paths formed in adjacent conductive elastic pads may be avoided.

In addition, when the test is completed, the conductive elastic sheet 12 is not pressured by the force F after the DUT 2 is removed. Since the conductive elastic sheet 12 has elastic force, the bump 1311 of the first contact end 131 will be pushed out, wherein since the bump 1311 may cause surface oxidation and increase the contact resistance during the test process, the rubbing between the surface of the bump 1311 and the conductive elastic sheet 12 during the insertion and push-out process can grind away the oxidized surface, ensure the stability of the contact resistance and clean the bump 1311. Therefore, even if the bump 1311 is not electroplated or otherwise surface treated, the stability of the contact resistance can still be maintained. In addition, disposing the conductive elastic sheet 12 on the elastic metal member 13 can prevent the bump 1311 of the elastic metal member 13 from directly pressing against the conductive block 21 of the DUT 2 and causing worn-out. That is, the conductive elastic sheet 12 can provide the bump 1311 with buffering and protection functions to reduce the possibility of damage to the elastic metal member 13. Better yet, the conductive elastic sheet 12 is only the one to be replaced to resume testing of the test socket of the present disclosure when the conductive elastic sheet 12 is worn. In this way, the process to search for the damaged probe from many probes when the probe is damaged in the conventional test socket can be reduced, thereby saving time and cost. Further, even if the conductive elastic sheet 12 is pressured or stabbed by the bump 1311 of the elastic metal member 13 during the test process, the conductive elastic sheet 12, however, has elastic force, so that the conductive elastic sheet 12 can return to the non-pressured state or slightly restore the stabbed position after the bump 1311 is pushed out. Therefore, even if the conductive elastic sheet 12 is stabbed by the bump 1311, the conductive elastic sheet 12 can still have a good lifespan.

In particular, the embedded type of the second type mentioned above (the bump 1311 of the elastic metal member 13 stabs the surface of the conductive elastic sheet 12 and enters the internal of the conductive elastic sheet 12) will have the following characteristics. First, the first contact end 131 is directly and electrically in contact with the conductive particles 124 in the conductive elastic sheet 12 by the bump 1311 to achieve the effect of rapid electrical conduction, and because the bump 1311 is embedded (inserted) into the conductive elastic sheet 12 and in contact with more conductive particles 124, the contact resistance can be effectively reduced; second, when each elastic metal member 13 stabs the surface of the conductive elastic sheet 12 with the bump 1311, the bump 1311 is inserted into the inside of the conductive elastic sheet 12, so that the bump 1311 of each elastic metal member 13 is completely covered by the conductive elastic sheet 12 and is not prone to shaking, thereby having the effect of maintaining stability and stable contact during the test process. That is, each elastic metal member 13 is not easily displaced (i.e., each elastic metal member 13 has accurate alignment) relative to the conductive block 21 of the DUT 2, so that the situation that the contact area between the probe and the device under test is small and the probe is damaged due to the displacement in the conventional testing environment can be avoided; third, the bump 1311 of the elastic metal member 13 will be inserted into the conductive elastic sheet 12 during the test, and will be pushed out by the elastic force of the conductive elastic sheet 12 at the end of the test. Therefore, the increase in the extent of friction between the elastic metal member 13 and the conductive elastic sheet 12 during the insertion and removal process of the elastic metal member 13 will provide a cleaning effect. Especially, the unclean surface of the bump 1311 due to oxidation or other aging will be improved by the friction between the elastic metal member 13 and the conductive elastic sheet 12, and the surface of the bump 1311 will remain as new at all times due to the aforementioned cleaning effect. Therefore, the bump 1311 of the elastic metal member 13 does not require additional surface processing and maintenance, and the cost can be reduced.

In one embodiment, a thickness T of the conductive elastic sheet 12 (i.e., the substrate 123) is greater than or equal to 0.15 millimeters (mm) and less than or equal to 2 mm. In short, if the thickness of the conductive elastic sheet 12 is insufficient, the conductive elastic sheet 12 may be easily stabbed; and if the thickness of the conductive elastic sheet 12 is too thick, the conductive path will be too long, causing the overall resistance to increase. In another embodiment, preferably, 0.150 mm≤thickness T≤1.5 mm, and according to experimental results, when the thickness T of the conductive elastic sheet 12 is less than or equal to 0.4 mm, the good conductive effect can be obtained without a significant increase in the contact resistance. In addition, the contact resistance can be adjusted by adjusting the thickness T of the conductive elastic sheet 12 and an inserted depth of the elastic metal member 13. For example, when increasing the thickness T of the conductive elastic sheet 12, the depth that the elastic metal member 13 entering the conductive elastic sheet 12 can be increased to maintain the contact resistance within the required range.

As shown in FIG. 6, when the bump 1311 of each elastic metal member 13 stabs a lower surface of the conductive elastic sheet 12 and sinks into the conductive elastic sheet 12, a distance t between a top end of the bump 1311 and an upper surface of the conductive elastic sheet 12 can be less than 0.35 mm, or a proportion of the distance t between the top end of the bump 1311 and the upper surface of the conductive elastic sheet 12 to the thickness T of the conductive elastic sheet 12 is less than 85%. Accordingly, even if the thickness of the conductive elastic sheet 12 changes, good contact resistance can still be maintained by adjusting the extent of embedding of the bump 1311 into the conductive elastic sheet 12.

In another embodiment, the particle size of each conductive particle 124 may be greater than or equal to 0.005 mm and less than or equal to 0.1 mm. That is, if the particle size is too small, there will be too many gaps between the particles and the resistance will be too high. If the particle size is too large, the elastic metal member 13 will be easily worn and the contact area is reduced; in addition, the percentage of the plurality of conductive particles 124 in the conductive elastic sheet 12 is preferably greater than or equal to 30% and less than or equal to 90%. In other words, if the particle density is too low, the resistance will be high; and if the particle density is too high, it means that there are few colloid components in the conductive elastic sheet 12, and the durability of the conductive elastic sheet 12 will also decrease.

Figure 7:
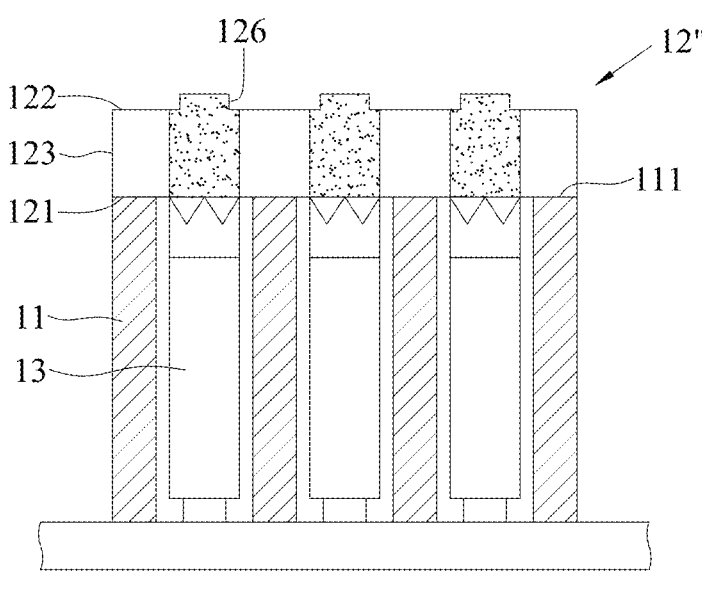
FIG. 7 is a schematic structural diagram of the test socket of the present disclosure with a conductive elastic sheet having convex pads.
Figure 8:
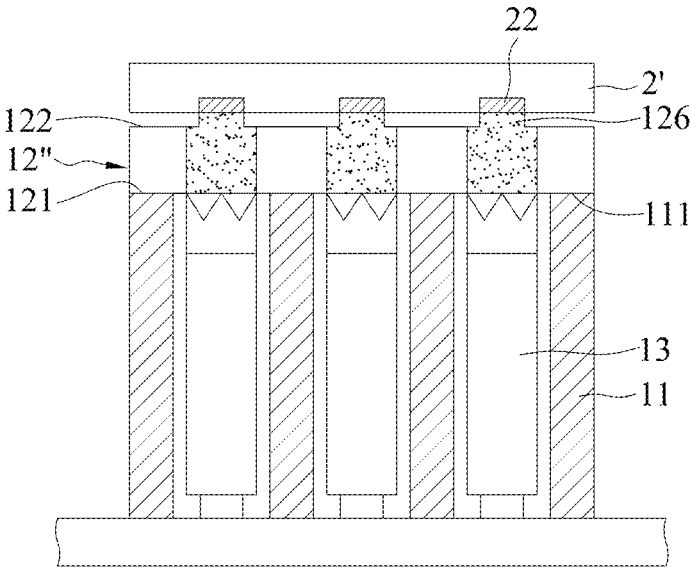
FIG. 8 is a schematic diagram illustrating the use of the test socket of the present disclosure with the conductive elastic sheet having the convex pads.

FIG. 7 is a schematic structural diagram of the test socket of the present disclosure with a conductive elastic sheet having convex pads, and FIG. 8 is a schematic diagram illustrating the use of the test socket of the present disclosure with the conductive elastic sheet having the convex pads. As shown in FIG. 7, a conductive elastic sheet 12" is disposed on the base 11 with the first contact surface 121 facing the first surface 111, and the second contact surface 122 corresponding to each elastic metal member 13 has a plurality of convex pads 126 protruding from the second contact surface 122. Accordingly, as shown in FIG. 8, an DUT 2' having a plurality of conductive pads 22 can be placed on the conductive elastic sheet 12" via each conductive pad 22 corresponding to each convex pad 126. In addition, in another embodiment, when the conductive pad 22 of the device under test is a recessed structure (not shown), each convex pad 126 enters the corresponding recessed conductive pad 22, and the conductive path is formed during the test process of the DUT 2'.

Figure 9:
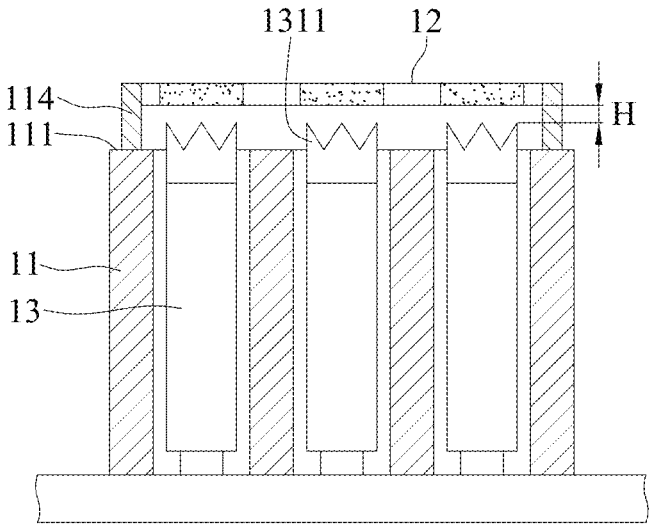
FIG. 9 is a schematic structural diagram of the test socket with a frame base of the present disclosure.

FIG. 9 is a schematic structural diagram of the test socket with a frame base of the present disclosure. As shown in FIG. 9, in one embodiment, the conductive elastic sheet 12 is disposed on a frame base 114 of the base 11 and spaced an interval distance H apart from the bump 1311 of each elastic metal member 13, and a gap is maintained between the conductive elastic sheet 12 and the first surface 111, wherein the conductive elastic sheet 12 can be floatably displaced in the vertical direction. Compared with the bumps 1311 of part of the elastic metal members 13 in FIG. 4 just slightly contacted the surface of the conductive elastic sheet 12 or stabbed into the conductive elastic sheet 12, each bump 1311 in this embodiment will only be in contact with the conductive elastic sheet 12 during testing, and the bump 1311 will only stab into the conductive elastic sheet 12 when a pressure test is performed, that is, the bump 1311 will not always be presented in the conductive elastic sheet 12 when not being tested. Furthermore, the position of the bump 1311 stabbing the conductive elastic sheet 12 may also be different each time, and the same region will not be stabbed repeatedly, so this embodiment can further provide the recovery time of the conductive elastic sheet 12, thereby extending the lifespan of the conductive elastic sheet 12.

Figure 10A:
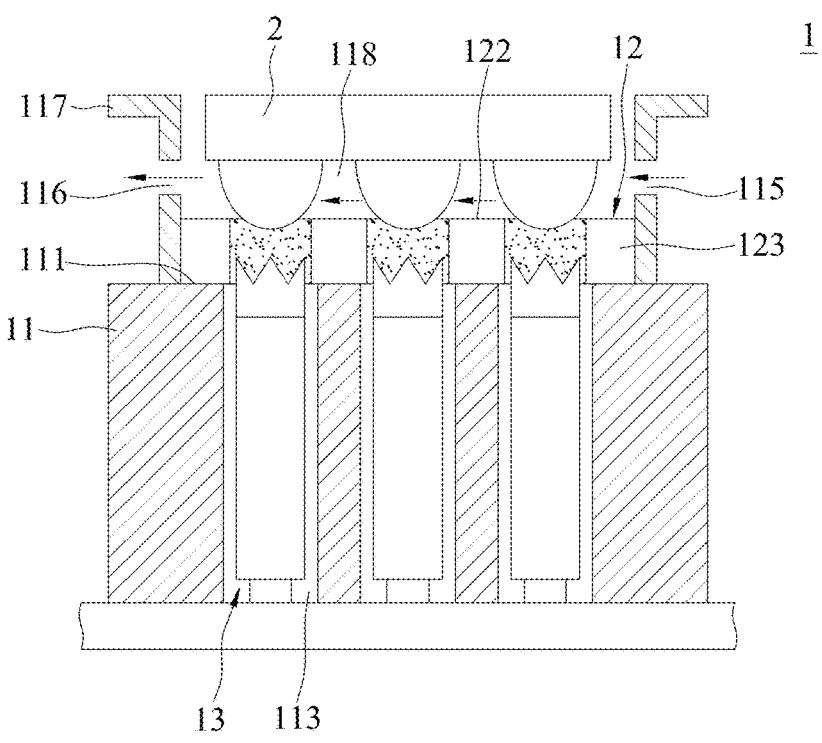
FIG. 10A to FIG. 10B are schematic structural diagrams of the test socket with a frame body of the present disclosure.
Figure 10B:
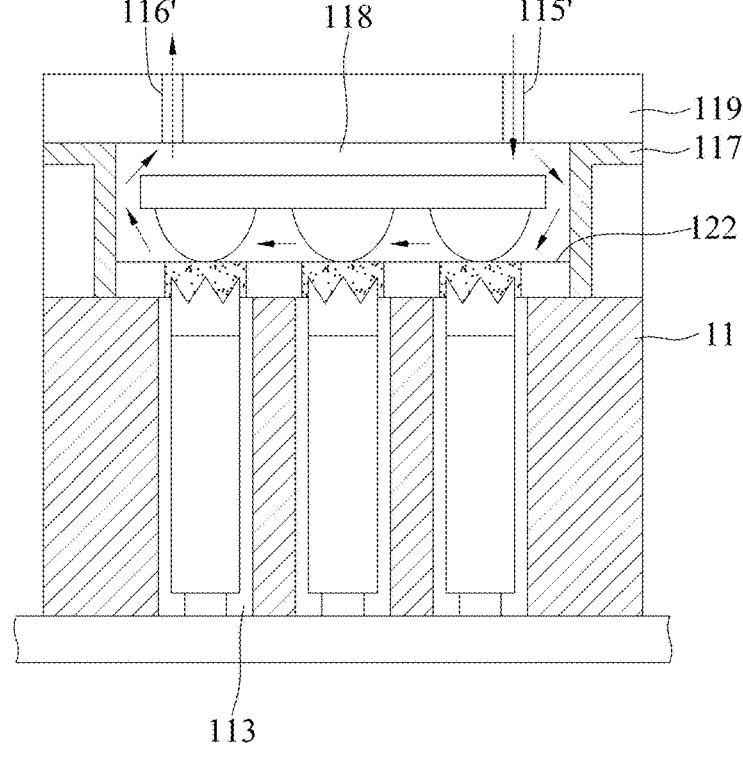

FIG. 10A to FIG. 10B are schematic structural diagrams of the test socket with a frame body of the present disclosure. As shown in FIG. 10A, the base 11 of the test socket 1 further comprises a frame body 117 disposed on the peripheral side of the substrate 123 of the conductive elastic sheet 12. Specifically, the frame body 117 is disposed on (e.g., fixed with glue) the first surface 111 of the base 11, and the conductive elastic sheet 12 can be surrounded by the frame body 117. In detail, the conductive elastic sheet 12 is disposed on the first surface 111 of the base 11 and seals each through hole 113, a space for fluid to enter is formed between the frame body 117 and the upper surface of the substrate 123 of the conductive elastic sheet 12 (i.e., the second contact surface 122 of the conductive elastic sheet 12), that is, when the DUT 2 is placed above the conductive elastic sheet 12, a fluid space 118 is formed between a bottom surface of the DUT 2 and the second contact surface 122 of the conductive elastic sheet 12, so that during the test process of the DUT 2, non-conductive fluid such as liquid or gas is introduced into the fluid space 118, and the fluid flows in the fluid space 118 (as shown by the arrows in FIG. 10A) to dissipate the heat from the DUT 2 and achieve the purpose of cooling the DUT 2. That is, by opening a fluid inlet 115 and a fluid outlet 116 connected to the fluid space 118 at the frame body 117, the fluid can enter the fluid space 118.

In addition, as shown in FIG. 10B, a sealing cover 119 having a fluid inlet 115' and a fluid outlet 116' can also be provided above the frame body 117, so that the fluid flows from the fluid inlet 115' into the fluid space 118 (as shown by the arrows in FIG. 10B), and is led out from the fluid outlet 116' to achieve the aforementioned heat dissipation and cooling purposes. In practical applications, the sealing cover 119 can be a part of the heat conduction device of a semiconductor test handler, for example. When the fluid flows into the fluid space 118, since the conductive elastic sheet 12 seals each through hole 113, the fluid can be prevented from flowing into each through hole 113. When the test is completed, the fluid just needs to be removed by pumping out of the liquid, filling with air flow, or other electronic controlling, so that the fluid space 118 can be cleaned, and the metal debris or dust can be prevented from falling into each through hole 113 during the test process and affecting the resistance of each elastic metal member 13. Further, the conductive elastic sheet 12 can prevent fluid (such as cooling liquid) from entering the through holes 113 during the test process and affecting the high-frequency electrical properties of each elastic metal member 13.

Figure 11:
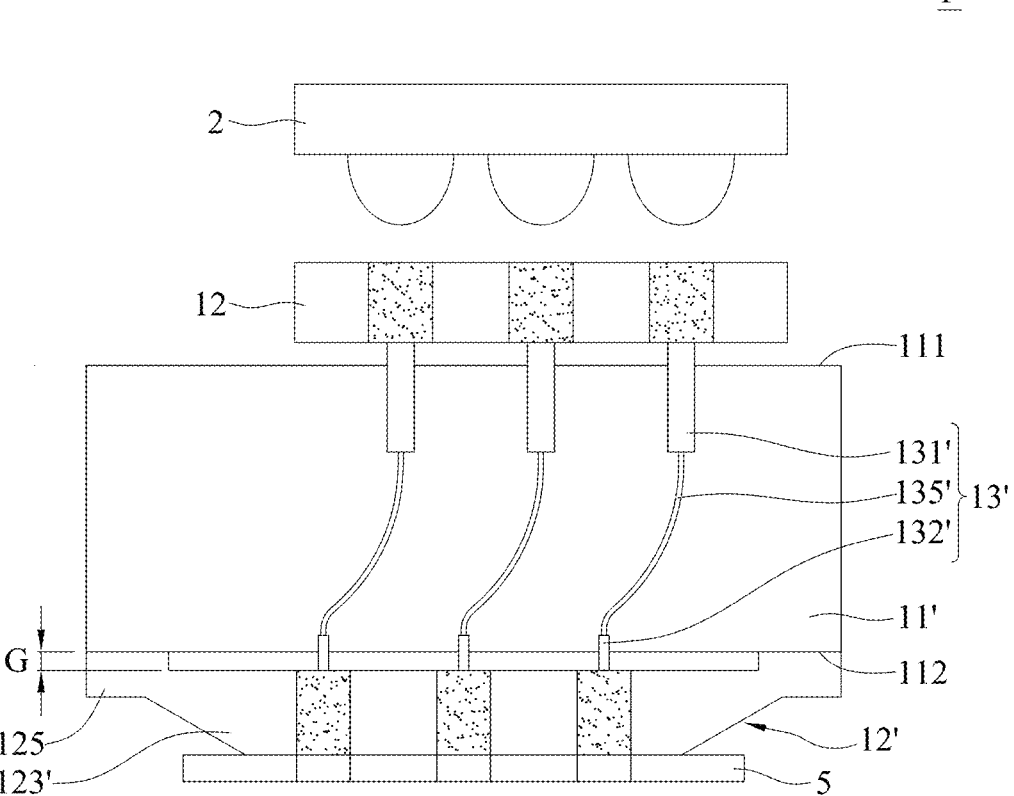
FIG. 11 is a structural diagram of the test socket of the present disclosure applied to a wafer.

FIG. 11 is a structural diagram of the test socket of the present disclosure applied to a wafer. As shown in FIG. 11, the conductive elastic sheet 12 and a conductive elastic sheet 12' are respectively provided on the first surface 111 and the second surface 112 of a base 11', wherein a support body 125 is disposed on the peripheral side of a substrate 123' of the conductive elastic sheet 12', the conductive elastic sheet 12' is disposed on the base 11' by the support body 125, so that the conductive elastic sheet 12' forms a tent-like structure, and there is a gap G between the substrate 123' and the second surface 112, so that a second contact end 132' of each elastic metal member 13' protrudes from the second surface 112 of the base 11' and is in contact with the conductive elastic sheet 12'. In an embodiment, the elastic metal member 13' can be a vertical probe (e.g., a cobra probe). It should be noted that the conductive elastic sheet 12' can be disposed on the second surface 112 of the base 11' as described above, but is not limited to the above. That is, the conductive elastic sheet 12' can be disposed on the first surface 111 of the base 11', of which the structural design is similar and will not be repeated here.

For example, when a test socket 1' of the present disclosure is applied in wafer testing, the test socket 1' can be a probe card and used to test a testing wafer 5, wherein the test socket 1' comprises the base 11' with a plurality of through holes, each elastic metal member 13' is respectively disposed in each through hole of the base 11' and comprises a first contact end 131' and the second contact end 132' protruding from the upper opening and the lower opening of each through hole respectively and an elastic member 135' disposed in each through hole and pushing against the first contact end 131' and the second contact end 132', whereby the conductive elastic sheet 12 can be disposed on the first surface 111 of the base 11' in the test socket 1' for disposing the DUT 2 thereon. In addition, the conductive elastic sheet 12' having the support body 125 can be disposed on the second surface 112 of the base 11', so that the second contact surface (the one facing upward in FIG. 11) of the conductive elastic sheet 12' will not be in contact with the second surface 112 of the base 11'. During the test, the first contact surface (the one facing downward in FIG. 11) of the conductive elastic sheet 12' will be in contact with the surface of the testing wafer 5 for testing.

Figure 12:
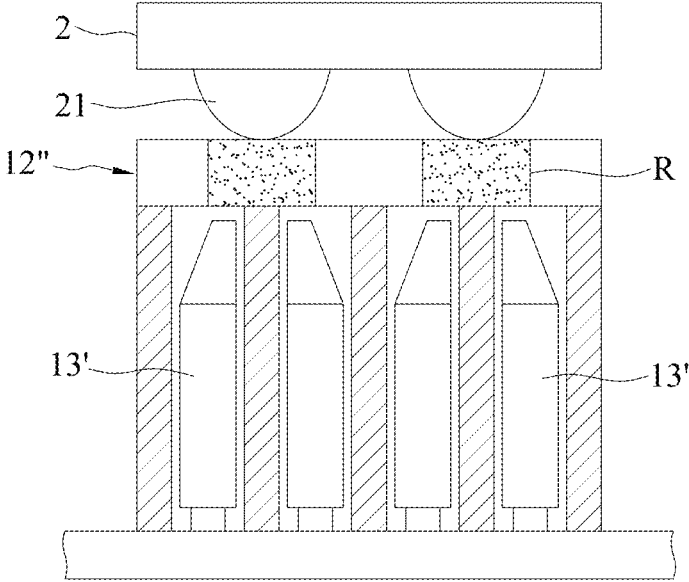
FIG. 12 is a structural diagram of the test socket of the present disclosure applied to four-terminal sensing (Kelvin contact).

FIG. 12 is a structural diagram of the test socket of the present disclosure applied to four-terminal sensing (Kelvin contact). As shown in FIG. 12, a conductive elastic region R can be made to correspond to a plurality of elastic metal members 13' according to requirements. For example, when applying the four-terminal sensing (Kelvin contact) technology, a conductive elastic region R can be made to correspond to two elastic metal members 13', that is, the two elastic metal members 13' share a conductive elastic region R, so that the conductive elastic region R is used for connecting one of the conductive blocks 21 of the DUT 2 and the plurality of elastic metal members 13' to perform the test procedure.

Figure 13A:
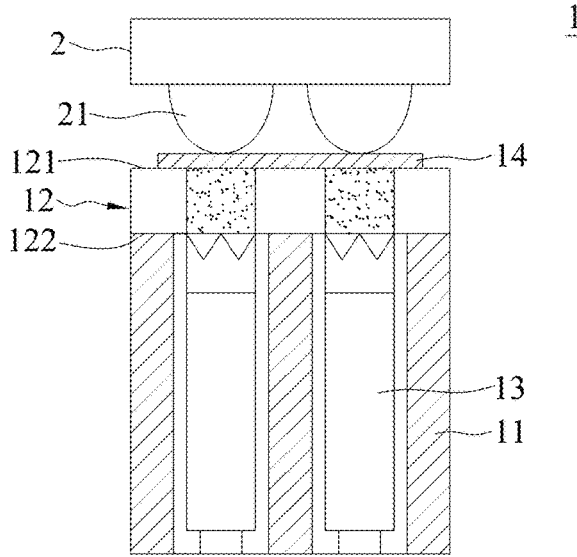
FIG. 13A to FIG. 13B are structural diagrams of the test socket of the present disclosure with a conductive member provided on the conductive elastic sheet.
Figure 13B:
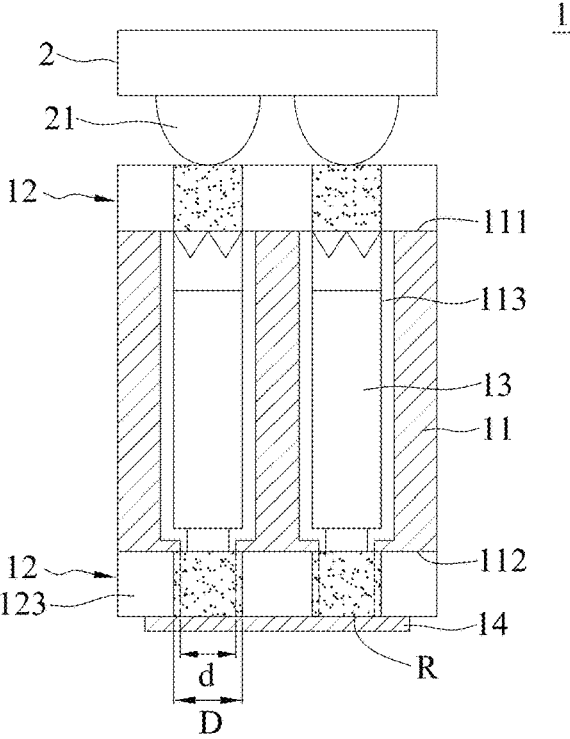

FIG. 13A to FIG. 13B are structural diagrams of the test socket of the present disclosure with a conductive member provided on the conductive elastic sheet. As shown in FIG. 13A, the test socket 1 of the present disclosure further comprises a conductive member 14 corresponding to at least two elastic metal members 13 and disposed on the first contact surface 121 or the second contact surface 122 of the conductive elastic sheet 12 (e.g., as the first contact surface 121 shown in FIG. 13A), wherein the conductive member 14 can be used to electrically connect the adjacent elastic metal members. In detail, when the elastic metal member 13 is a ground probe, the conductive member 14 can be used to electrically connect the adjacent ground probes, or when the elastic metal member 13 is a power probe, the conductive member 14 can be used to electrically connect the adjacent power probes, wherein in one embodiment, as shown in FIG. 13A, the conductive member 14 is disposed on the first contact surface 121 of the conductive elastic sheet 12; in another embodiment, the conductive member 14 can be disposed on the second contact surface 122 of the conductive elastic sheet 12, that is, disposed between the elastic metal member 13 and the conductive elastic sheet 12; and in this embodiment, since the conductive member 14 is located between the elastic metal member 13 and the conductive elastic sheet 12, there is a hollow part (not shown) at the corresponding position of the elastic metal member 13, so that the elastic metal member 13 can contact the conductive elastic sheet 12 via the hollow part. In addition, as shown in FIG. 13B, the test socket 1 of the present disclosure further comprises another conductive elastic sheet 12 located under the second surface 112 of the base 11 and the conductive member 14 corresponding to at least two elastic metal members 13 and located on a lower surface of the another conductive elastic sheet 12, wherein the conductive member 14 can be used as a conductive line or ground. In summary, by disposing the conductive member 14 on the conductive elastic sheet 12, the plurality of conductive blocks 21 of the DUT 2 are connected or grounded together via conductive lines. Furthermore, when a high-current power signal is provided, the conductive member 14 disposed on the conductive elastic sheet 12 can also serve as a shunt. In addition, the conductive elastic sheet 12 can strengthen the contact with the first surface 111 or the second surface 112 of the base 11 by increasing the area or position of the conductive elastic region, and can also provide grounding function.

Furthermore, as shown in FIG. 13B, the base 11 is a metal base body, and the width of each conductive elastic region of the conductive elastic sheet 12 is larger than the diameter of each through hole 113, so that each conductive elastic region can contact the base 11, that is, an aperture d of the through hole 113 (shown as the aperture on the second surface 112) is smaller than a width D of each conductive elastic region R of the conductive elastic sheet 12. In other words, the aperture d is smaller than the width D. Accordingly, each elastic metal member 13 can be electrically connected to the base 11 made by metal via each conductive elastic pad, thereby improving the grounding probability of each elastic metal member 13. Therefore, the conductive member 14 can also be omitted.

Figure 14A:
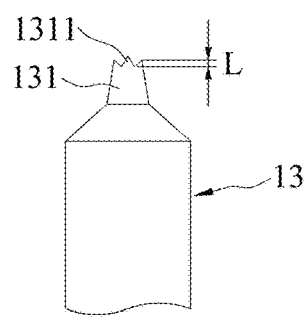
FIG. 14A to FIG. 14C are structural diagrams of elastic metal members of the test socket of the present disclosure with different designs.
Figure 14B:
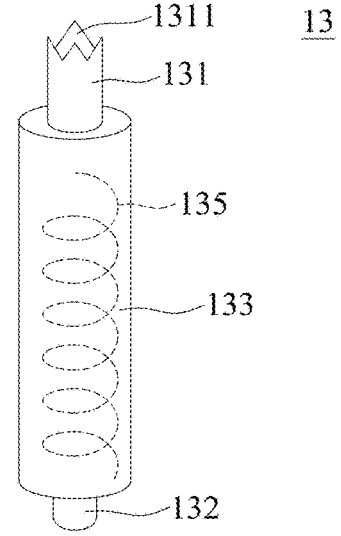
Figure 14C:
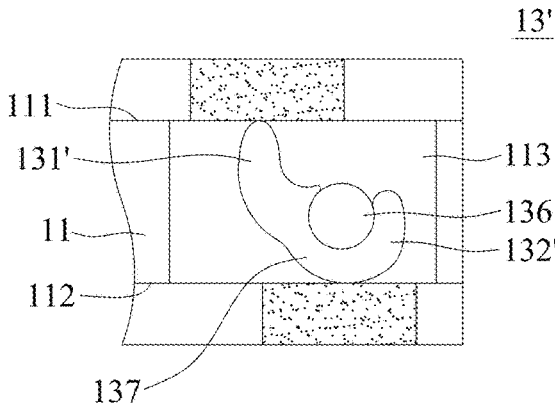

FIG. 14A to FIG. 14C are structural diagrams of elastic metal members of the test socket of the present disclosure with different designs. As shown in FIG. 14A, the bump 1311 of each elastic metal member 13 may have a pointed structure. In one embodiment, a length L of the bump 1311 is greater than or equal to 0.01 mm and less than the thickness T of the conductive elastic sheet (as shown in FIG. 4). In other words, the bump 1311 of the first contact end 131 merely needs to be able to stab the conductive elastic sheet and enter the interior thereof without stabbing through the conductive elastic sheet. The length L is not limited to the above, that is, the bump 1311 stabs the conductive elastic sheet with at least 0.01 mm by controlling the travel of the first contact end 131 of the elastic metal member 13 (or the elastic force that pushes the first contact end 131 to move) during the test, thereby reducing the contact resistance between the elastic metal member 13 and the conductive elastic sheet.

As shown in FIG. 14B, in one embodiment, the elastic metal member 13 comprises a main body 133 with a tube hole, the first contact end 131 and the second contact end 132 respectively disposed at two ends of the tube hole, and an elastic member 135 (such as spring) located in the tube hole and pushing against the first contact end 131 and the second contact end 132. In one embodiment, the first contact end 131 of the elastic metal member 13 of the present disclosure has a rough or concave-convex surface, which can provide a larger contact area to achieve the purpose of reducing the contact resistance. Specifically, the first contact end 131 has a plurality of the bumps 1311. In an embodiment, each bump 1311 has a pointed structure, and the whole first contact end 131 can be a crown structure, so that the elastic metal member 13 can be stabbed into the conductive elastic sheet by each pointed structure. Accordingly, after the first contact end 131 being the crown shape is stabbed into the conductive elastic sheet with each bump 1311, it has the effect of gathering conductive particles (please refer to FIG. 6). That is, the conductive particles can be limited to the range surrounded by the crown structure, so that the conductive path can have a better conductive effect when the conductive path is formed.

As shown in FIG. 14C, in another embodiment, each elastic metal member 13' further comprises an elastomer 136 (e.g., an elastic body) disposed in the through hole 113 and a metal block 137 rotatably disposed on the elastomer 136. The metal block 137 extends toward the first surface 111 of the base 11 and is connected to the first contact end 131', and extends toward the second surface 112 of the base 11 and is connected to the second contact end 132'. In another embodiment, the elastic metal member 13' can be a structure applied to a probe card as shown in FIG. 8. The structure has been described above and will not be repeated.

Figure 1:
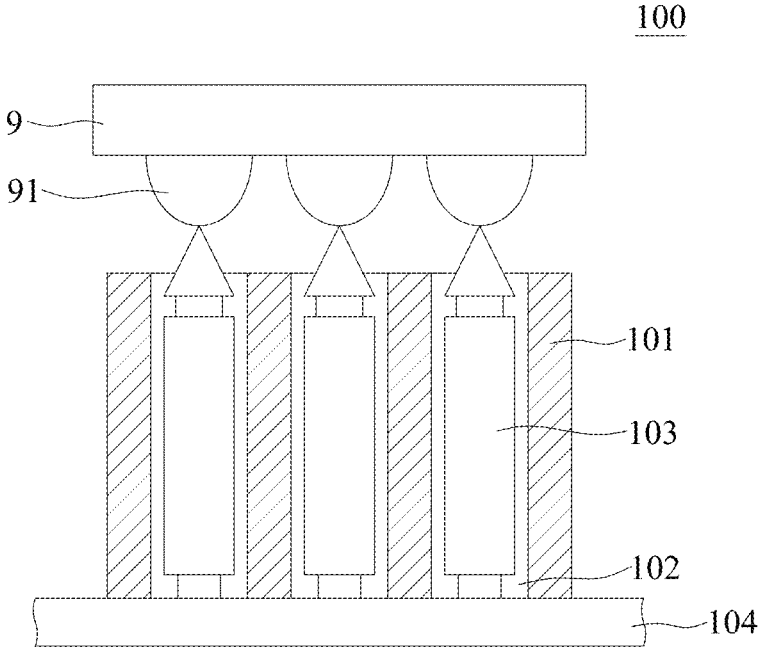
FIG. 1 is a structural diagram of a conventional test socket for testing a device under test.

Subsequent experiments will illustrate the efficacy of the test socket of the present disclosure to show the difference in the aforementioned efficacy of the test socket of the present disclosure (for example, as shown in FIG. 2 to FIG. 4) compared with the conventional test socket (as shown in FIG. 1). During the test process, the present disclosure and the conventional test socket use the same type of elastic metal member (such as probe), and are tested in the same experimental environment and conditions. The relevant description is as follows.

Figure 15A:
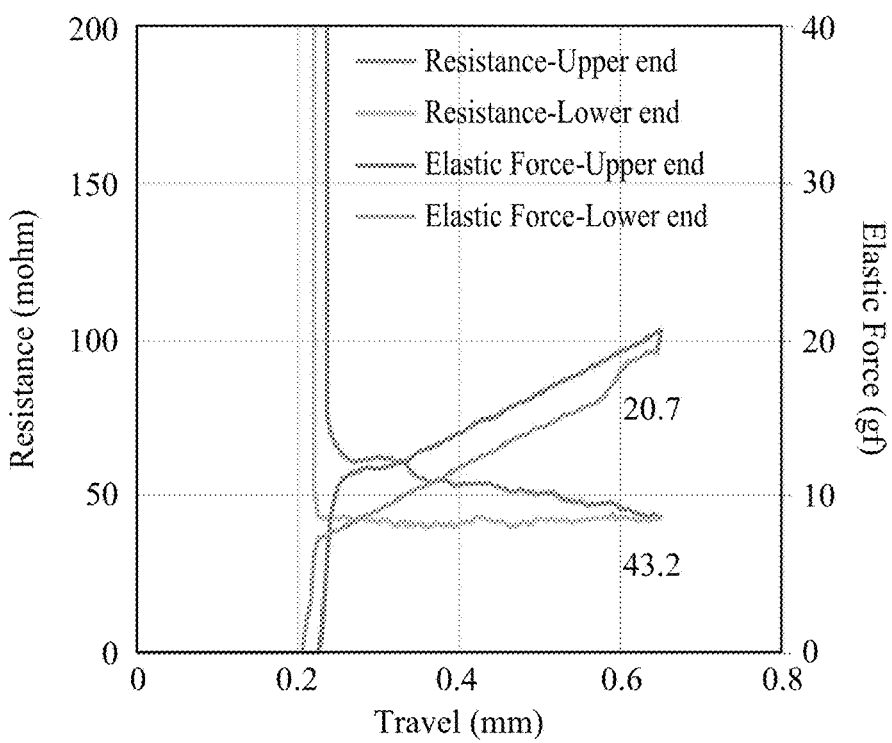
FIG. 15A to FIG. 15B are diagrams showing the relationship between the resistance of the probe of the conventional test socket and the conductive block of the device under test, and the elastic force of the elastic metal member.
Figure 15B:
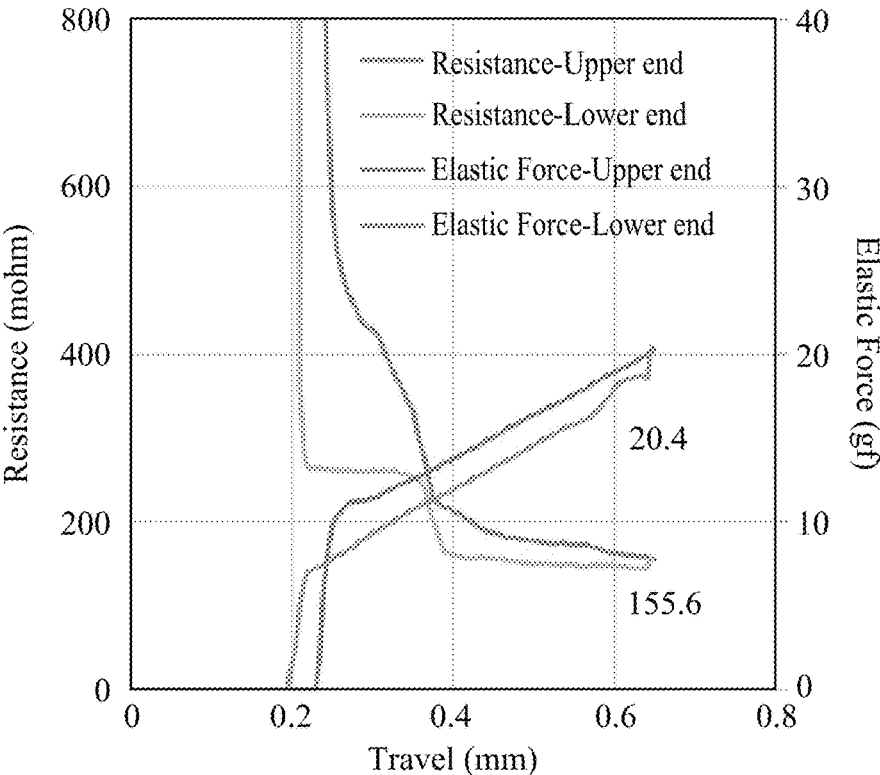
Figure 16A:
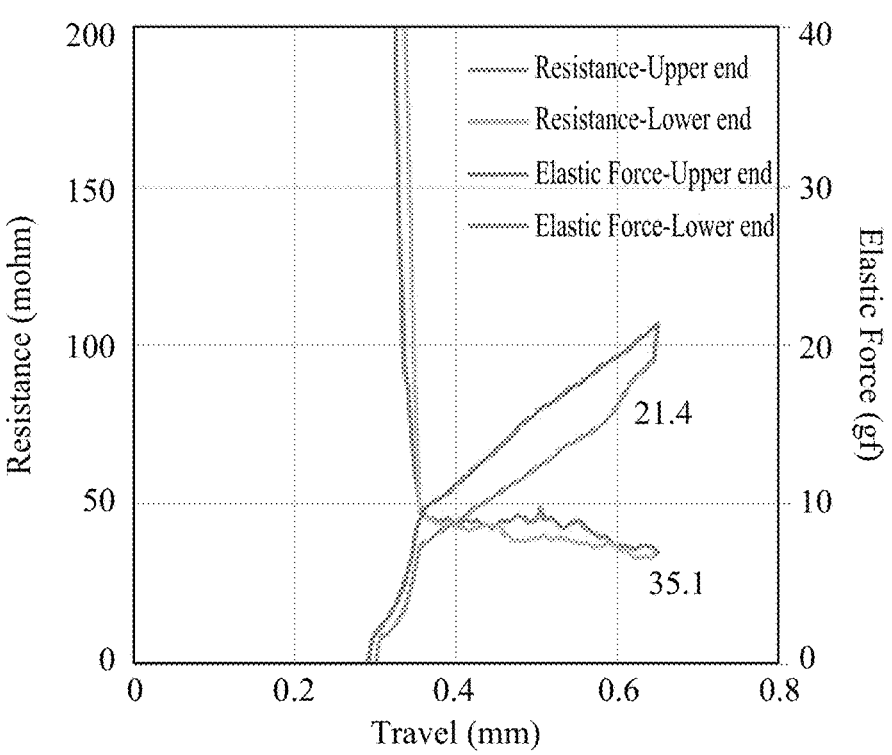
FIG. 16A to FIG. 16B are diagrams showing the relationship between the resistance of the elastic metal member of the test socket of the present disclosure and the conductive block of the device under test, and the elastic force of the elastic metal member.
Figure 16B:
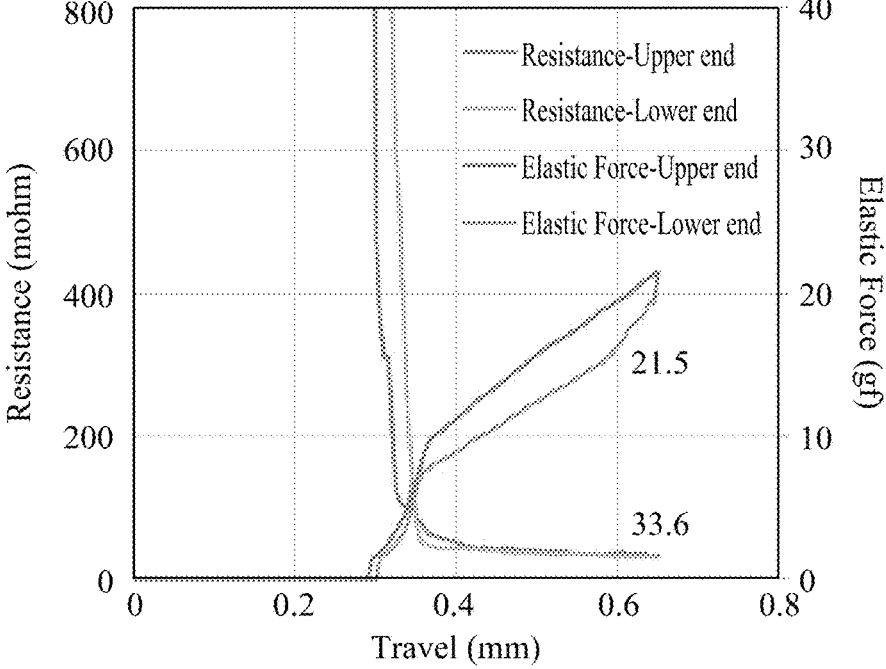

FIG. 15A to FIG. 15B are diagrams showing the relationship between the resistance of the probe of the conventional test socket and the conductive block of the device under test, and the elastic force of the elastic metal member. FIG. 16A to FIG. 16B are diagrams showing the relationship between the resistance of the elastic metal member of the test socket of the present disclosure and the conductive block of the device under test, and the elastic force of the elastic metal member. As shown in FIG. 15A, the probe of the conventional test socket has an elastic force of 20.7 gram-force (gf) and a resistance of 43.2 milliohms (mΩ) in the initial stage of use. Then, as shown in FIG. 15B, after being used for a period of time, the elastic force of the probe of the conventional test socket is dropped to 20.4 gf, and the resistance is increased to 155.6 milliohms (mΩ); on the contrary, as shown in FIG. 16A, the elastic force of the probe (i.e., the elastic metal member) of the test socket of the present disclosure is 21.4 gf and the resistance is 35.1 milliohms (mΩ) in the initial stage of use. Then, as shown in FIG. 16B, after being used for a period of time, the elastic force of the probe of the present disclosure can still be maintained at 21.5 gf, and the resistance is further reduced to 33.6 milliohms (mΩ). It is clear that the same probe used in the structure of the present disclosure can maintain the elastic force of the probe; and in terms of resistance performance, the resistance will not double as in the conventional test results, and the effect of reducing the resistance can also be achieved. In addition, from the resistance performance in FIG. 16B when the travel is 0.4 mm to 0.6 mm, it can be seen that the lines of this embodiment are smooth without any instability caused by trembling, thereby confirming that the present disclosure can provide good contact stability even at low travel.

Furthermore, it can be seen from FIG. 15A that the resistance of the probe of the conventional test socket slowly decreases to 50 milliohms (mΩ) as the travel of the probe tip changes. As shown in FIG. 15B, the resistance can no longer even be reduced to 50 milliohms (mΩ) after a period of use; on the contrary, as shown in FIG. 16A and FIG. 16B, the test socket of the present disclosure and the conductive block of the device under test can immediately reduce the resistance to below 50 milliohms (mΩ) after being pressed, and the aforementioned characteristics can still be maintained even after a period of use.

Figure 17A:
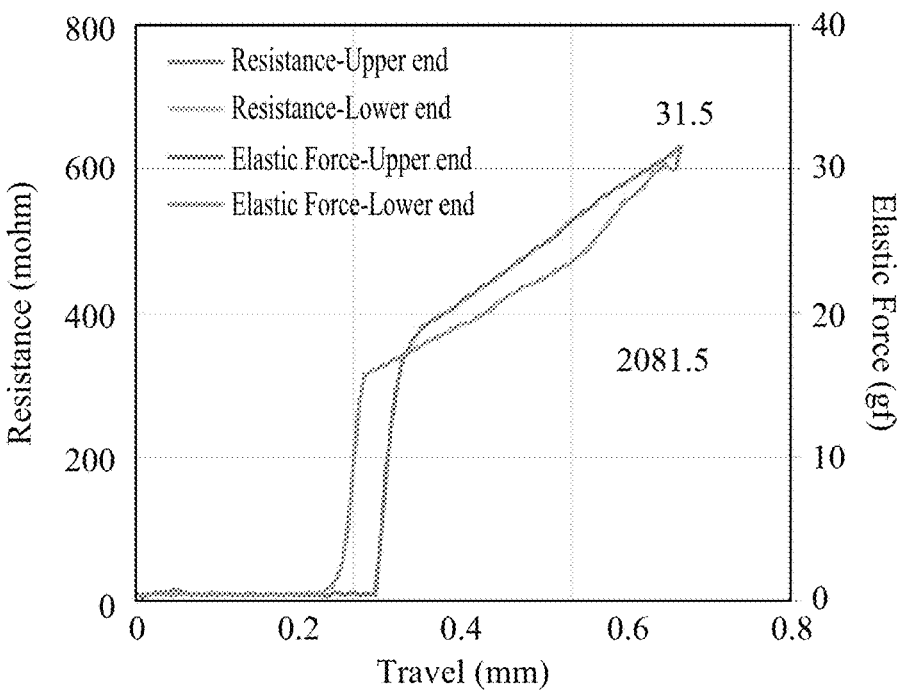
FIG. 17A to FIG. 17B are diagrams respectively showing the relationship between the resistance of the probe of the conventional test socket and the elastic metal member of the test socket of the present disclosure without surface treatment, and the elastic force of the elastic metal member.
Figure 17B:
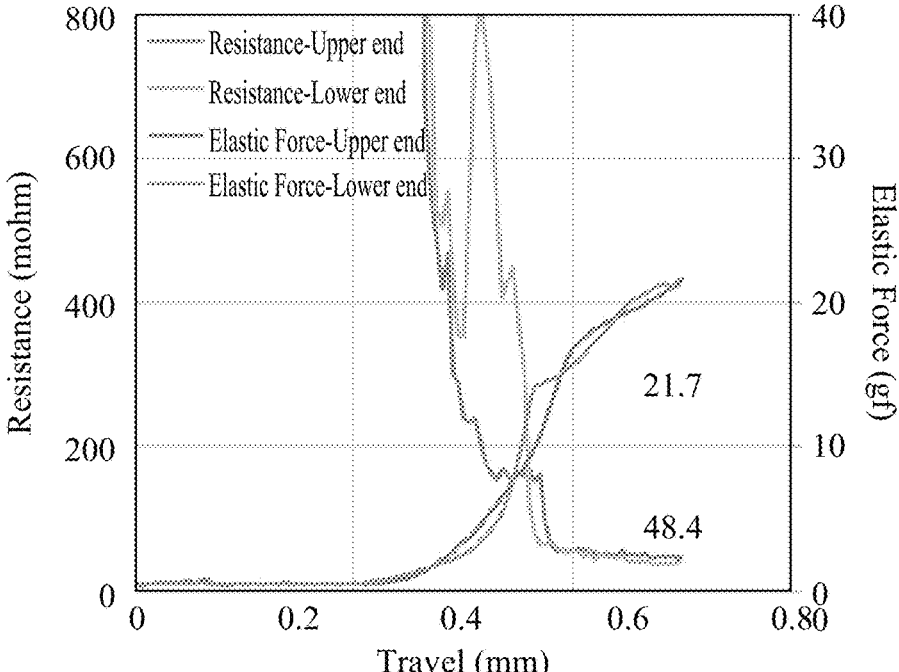

FIG. 17A to FIG. 17B are diagrams respectively showing the relationship between the resistance of the probe of the conventional test socket and the elastic metal member of the test socket of the present disclosure without surface treatment, and the elastic force of the elastic metal member. The diagrams illustrate the performance of the probe tip of the probe without surface treatment such as electroplating. It should be noted that, as shown in FIG. 17A, the resistance of the probe of the conventional test socket is as high as 2081.5 milliohms (mΩ). As shown in FIG. 17B, the probe of the test socket (i.e., the elastic metal member) of the present disclosure can still be maintained at about 50 milliohms (mΩ), that is, 48.4 milliohms (mΩ). Accordingly, it can be seen that the probe tip (the bump of the first contact end) of the probe (the elastic metal member) of the present disclosure without surface treatment can still be better than the conventional design and can lower the manufacturing cost.

Figure 18:
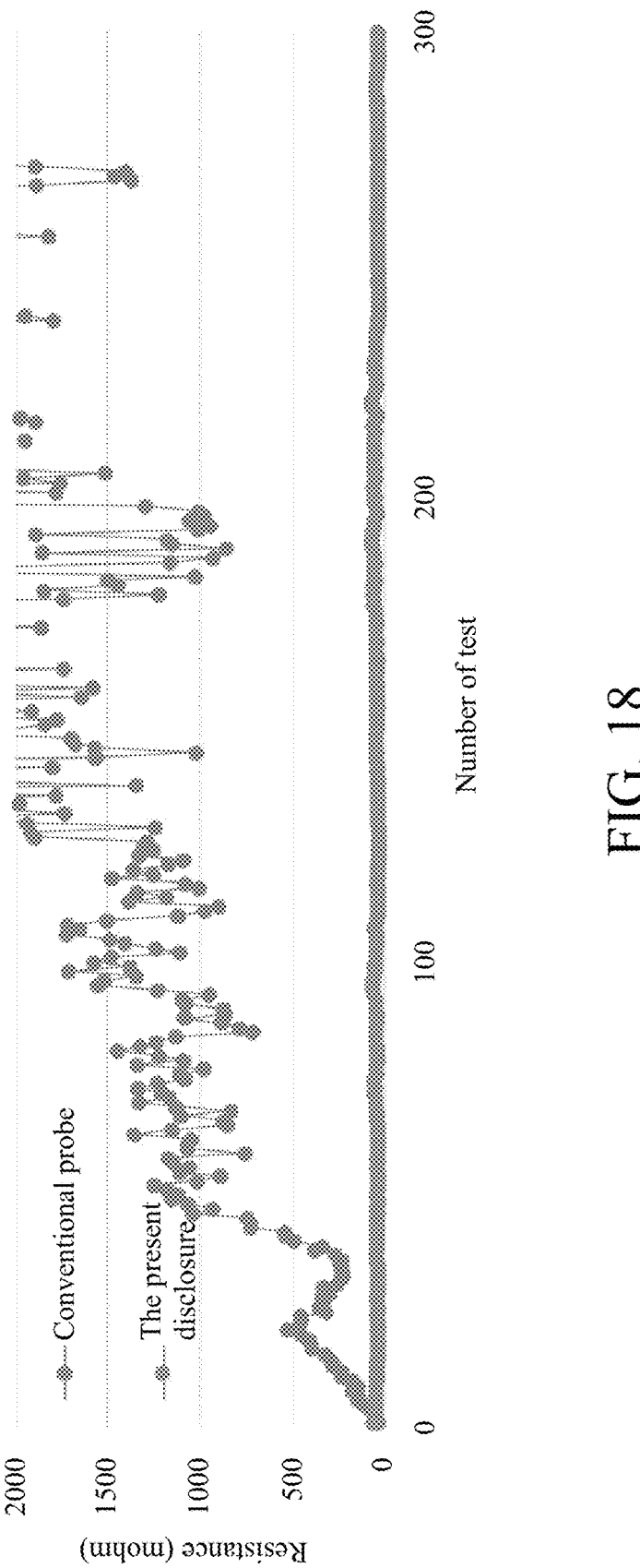
FIG. 18 is a diagram showing the change in resistance of the probe of the conventional test socket and the elastic metal member of the test socket of the present disclosure after repeated tests.
Figure 19A:
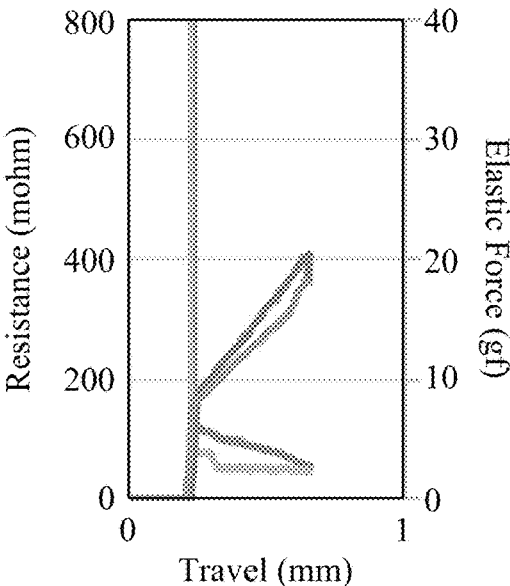
FIG. 19A to FIG. 19B are diagrams respectively showing the relationship between the resistance of the probe of the conventional test socket after the first use and after 300 tests and the elastic force of the elastic metal member.
Figure 19B:
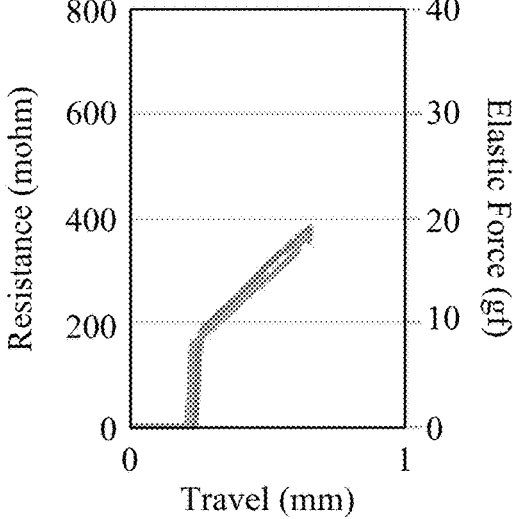
Figure 20A:
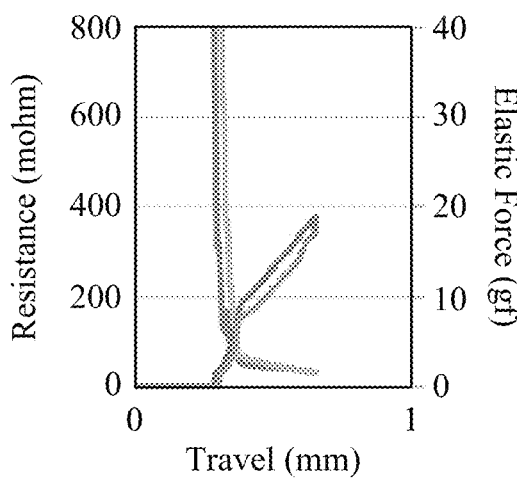
FIG. 20A to FIG. 20B are diagrams respectively showing the relationship between the resistance and the elastic force of the elastic metal member of the test socket of the present disclosure after the first use and after 300 tests.
Figure 20B:
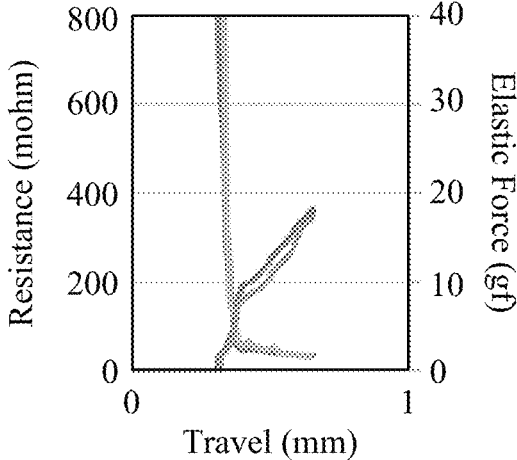

FIG. 18 is a diagram showing the change in resistance of the probe of the conventional test socket and the elastic metal member of the test socket of the present disclosure after repeated tests. FIG. 19A to FIG. 19B are diagrams respectively showing the relationship between the resistance of the probe of the conventional test socket after the first use and after 300 tests and the elastic force of the elastic metal member. FIG. 20A to FIG. 20B are diagrams respectively showing the relationship between the resistance and the elastic force of the elastic metal member of the test socket of the present disclosure after the first use and after 300 tests. As shown in FIG. 18, the changing trend of the resistance of the probe after multiple uses is illustrated. It is known that the resistance of the probe in the conventional test socket increases significantly after several uses, and as can be seen from FIG. 18, the resistance is more unstable. On the other hand, even if the probe of the test socket of the present disclosure undergoes multiple tests, the resistance can still be maintained stably at the best performance level. That is, even if the probe of the present disclosure is used several times, the resistance performance of the probe of the present disclosure can still be maintained as a new probe.

Further, as shown in FIG. 19A, the resistance and elastic force of the conventional probe have normal performance when used for the first time. As shown in FIG. 19B, after being used 300 times, the resistance of the conventional probe exceeds 800 milliohms (mΩ) and the conventional probe is unusable; on the contrary, as shown in FIG. 20A and FIG. 20B, the probe of the present disclosure still maintains as the initial state and has a good resistance even after using 300 times.

Figure 21A:
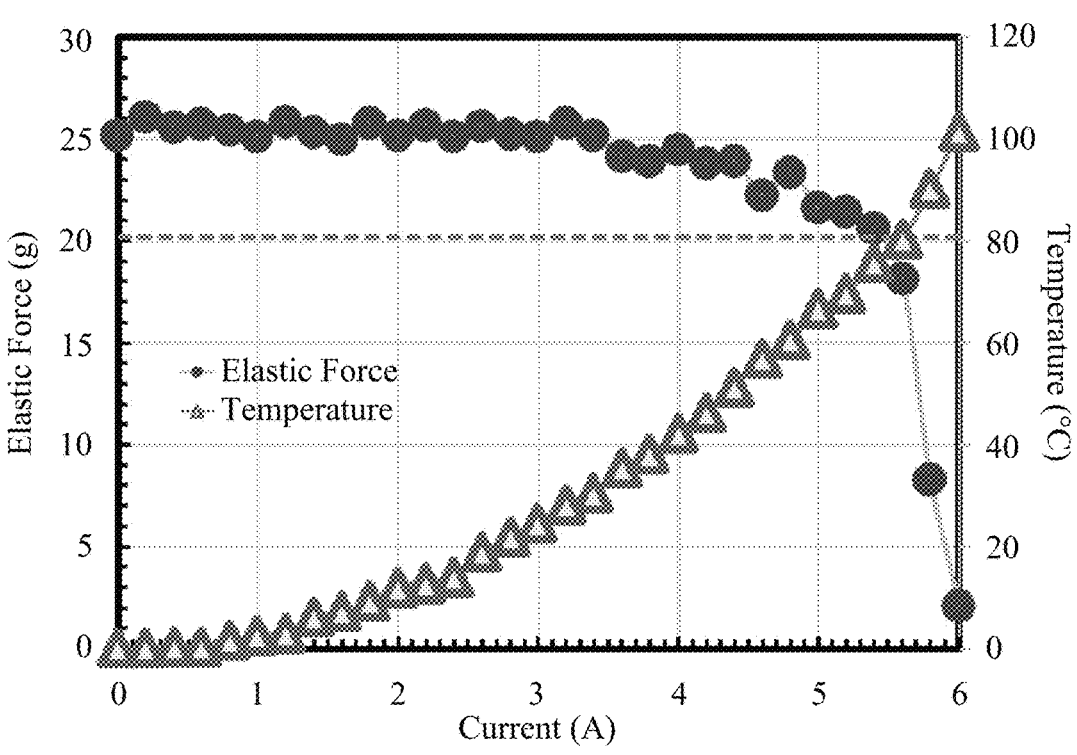
Figure 21B:
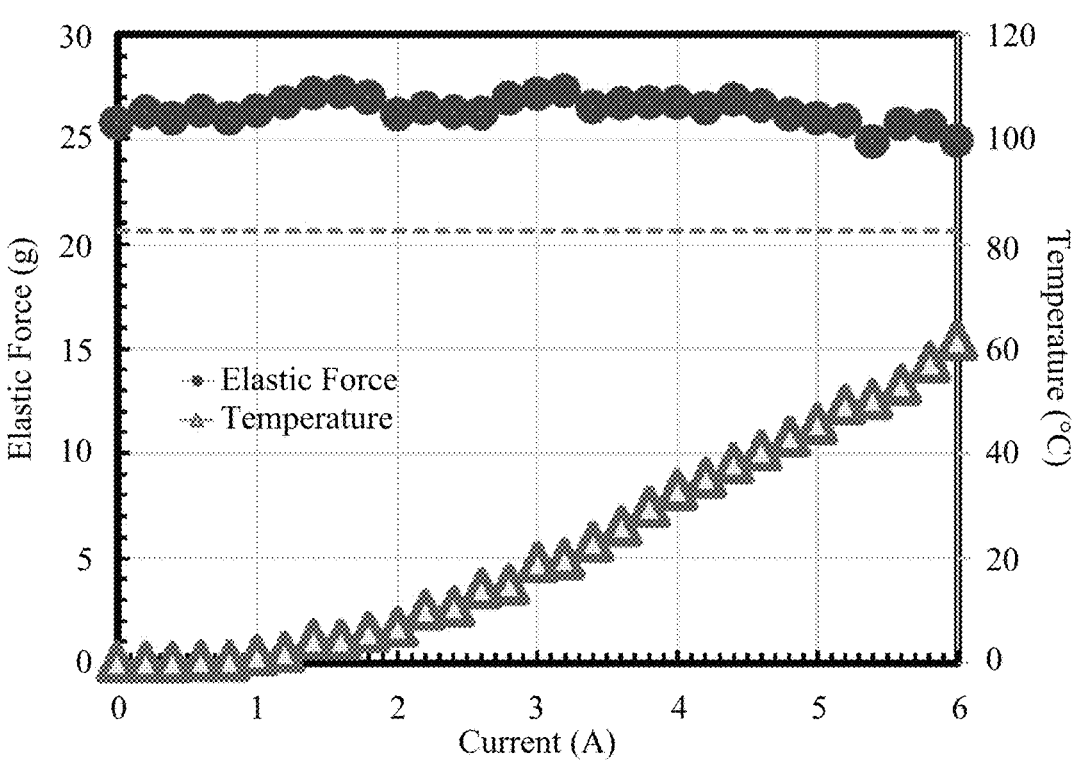

FIG. 21A to FIG. 21B are run charts respectively showing the elastic force and temperature change of the probe of the conventional test socket and the elastic metal member of the test socket of the present disclosure when a current of 6 ampere is passed through. The diagrams illustrate the changes in elastic force and temperature of the probe when a continuous current of 6 ampere is applied to the probe. As shown in FIG. 21A, the temperature of the probe of a conventional test socket rises to 101.6° C. (which is over 100° C.) after a current of 6 ampere is applied to the probe, and the elastic force thereof has dropped to close to 0 g. In contrast, as shown in FIG. 21B, the elastic force of the probe in the test socket of the present disclosure can be maintained at about 25 g; in addition, the temperature is only 61.7° C., which is about 40° C. lower than the temperature of the conventional probe. It can be seen that the test socket of the present disclosure still has good performance even if it is applied in a high-current testing environment.

Figure 22A:
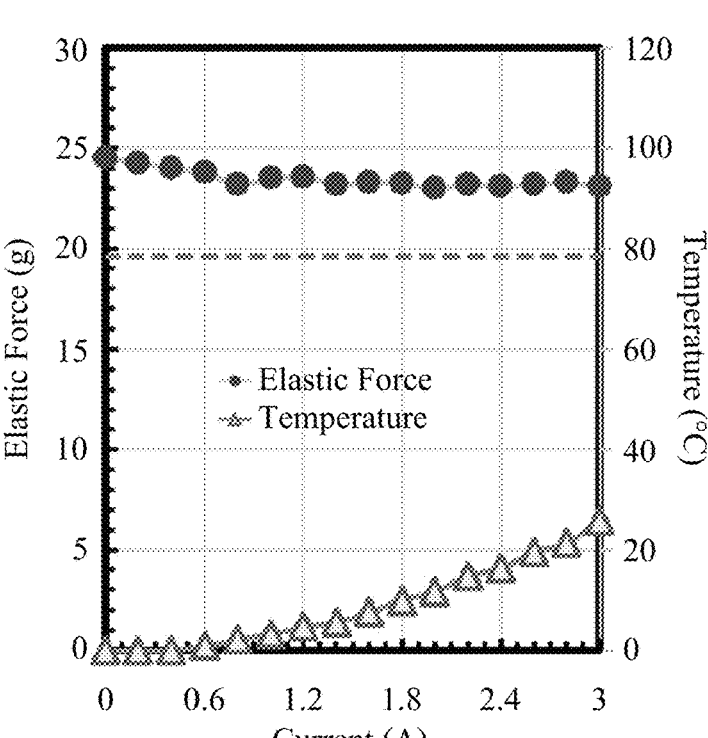
Figure 22B:
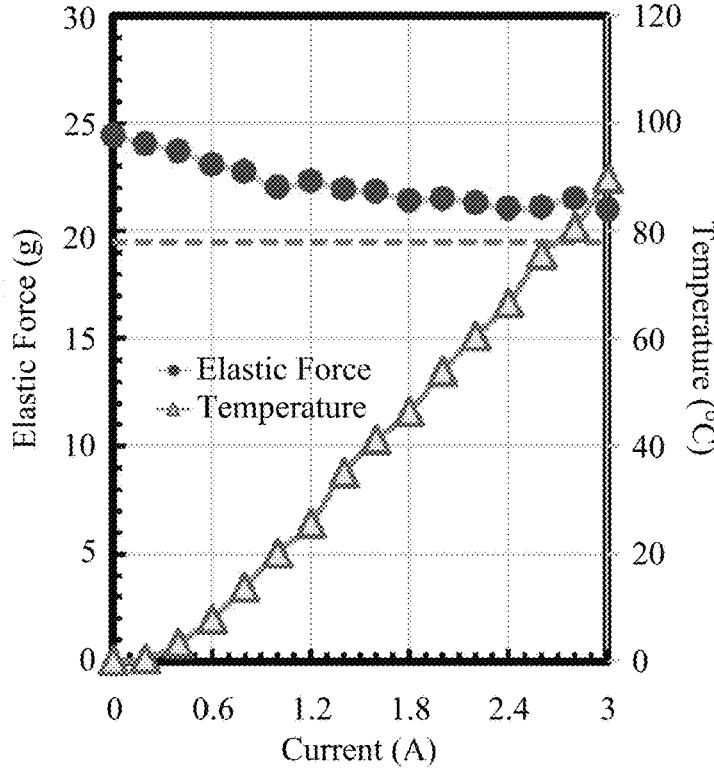
Figure 22C:
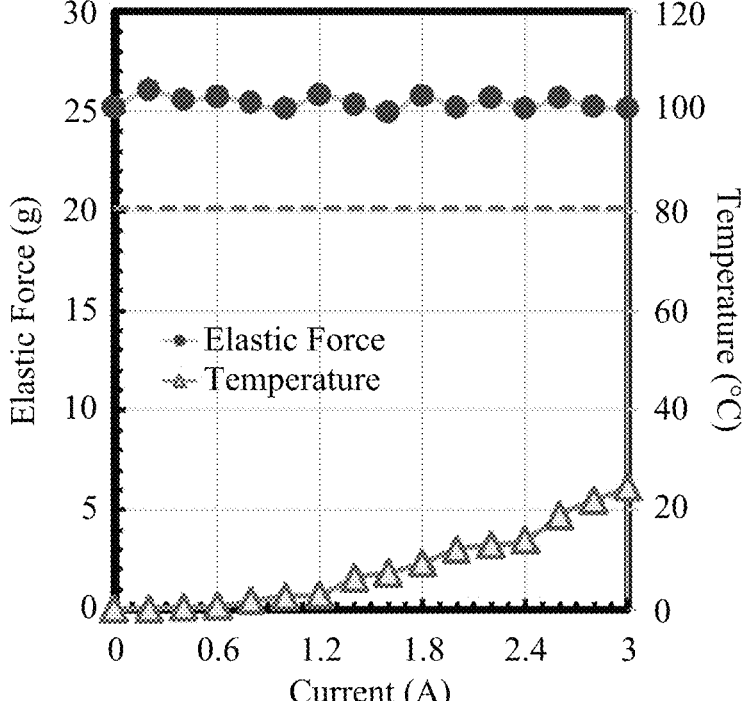

FIG. 22A to FIG. 22C are run charts respectively showing the elastic force and temperature change of the old and new probes of the conventional test socket and the used elastic metal member of the test socket of the present disclosure when a current of 3 ampere is passed through. Specifically, the conventional probe is measured with a resistance of 37.5 milliohms (mΩ) when not in use. After a considerable number of tests, the resistance of the conventional probe is risen to 171.2 milliohms (mΩ). The present disclosure uses a probe (i.e., an elastic metal member) that has been used several times, and the resistance thereof is 37.7 milliohms (mΩ), and a current of 3 ampere is passed to conduct the experiment based on the above conditions. As shown in FIG. 22A, although a conventional test socket with the new probe is used (i.e., the conventional probe is not used) and the elastic force of the new probe can be maintained when a current of 3 ampere is applied, the temperature of the new probe, however, reaches 24.6° C. In addition, as shown in FIG. 22B (a conventional test socket with an old probe), as the number or time of use increases, the resistance of the conventional probe increases to 171.2 milliohms (mΩ); and when a current of 3 ampere is applied, not only the elastic force is affected, the temperature of the conventional probe also rises over 80° C., reaching as high as 89.680° C. On the contrary, as shown in FIG. 22C, the resistance of the probe of the test socket of the present disclosure remains at 37.7 milliohms (mΩ) even if the probe of the test socket of the present disclosure has been used several times; and when a current of 3 ampere is applied, the elastic force performance of the probe of the test socket of the present disclosure can still be well maintained, and the temperature of the probe of the test socket of the present disclosure merely rises to 25.8° C. Therefore, the performance of the probe (i.e., the elastic metal member) of the present disclosure can still be well maintained with that of the new probe of the conventional technology even if the probe of the present disclosure is used several times, thereby proving that the test socket of the present disclosure can indeed achieve good performance.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims, as long as it does not affect the effect and implementation purpose of the present disclosure, it should be covered by this disclosed technical content.

What is claimed is:

1. A test socket, comprising:
a base having a first surface, a second surface opposing the first surface, and a plurality of through holes connecting the first surface and the second surface;
a conductive elastic sheet located above the first surface of the base; and
a plurality of elastic metal members respectively disposed in the plurality of through holes, wherein the elastic metal member has a first contact end facing the conductive elastic sheet, and the first contact end comprises a bump suitable for inserting in the conductive elastic sheet, wherein the base further comprises a frame body disposed on a peripheral side of the conductive elastic sheet and having a fluid inlet and a fluid outlet, wherein the conductive elastic sheet is disposed on the first surface of the base, and the frame body and upper side surface of the conductive elastic sheet define a fluid space in communication with the fluid inlet and the fluid outlet.

2. The test socket of claim 1, wherein the bump of the elastic metal member is suitable for stabbing into a surface of the conductive elastic sheet so as to be inserted into an interior of the conductive elastic sheet.

3. The test socket of claim 1, wherein the bump of the elastic metal member is in plural and pointed.

4. The test socket of claim 1, wherein the bump of the elastic metal member is pressed against the conductive elastic sheet and inserted into the conductive elastic sheet, such that the conductive elastic sheet covers the bump.

5. The test socket of claim 1, wherein the elastic metal member is a spring probe, a vertical probe, or a microelectromechanical probe.

6. The test socket of claim 1, wherein the conductive elastic sheet is disposed on a frame base of the base and spaced an interval distance apart from the bump of the elastic metal member.

7. The test socket of claim 1, wherein a length of the bump is greater than or equal to 0.01 millimeters (mm) and less than a thickness of the conductive elastic sheet.

8. The test socket of claim 1, wherein the elastic metal member further comprises an elastomer disposed in each of the through holes, a metal block rotatably disposed on the elastomer and for connecting to the first contact end, and a second contact end connected to the metal block and extending towards the second surface.

9. The test socket of claim 1, wherein the base is a metal base body, and the conductive elastic sheet comprises a plurality of conductive elastic regions corresponding to the elastic metal members respectively and a plurality of conductive particles distributed in each of the conductive elastic regions, wherein a width of the conductive elastic region is larger than a diameter of the through hole, such that the conductive elastic region is in contact with the base.

10. The test socket of claim 1, wherein a thickness of the conductive elastic sheet is greater than or equal to 0.15 mm and less than or equal to 2 mm.

11. The test socket of claim 10, wherein a thickness of the conductive elastic sheet is greater than or equal to 0.15 mm and less than or equal to 0.4 mm.

12. The test socket of claim 1, wherein the conductive elastic sheet comprises a substrate and a plurality of conductive particles distributed in the substrate.

13. The test socket of claim 12, wherein a particle diameter of the conductive particles is greater than or equal to 0.005 mm and less than or equal to 0.1 mm.

14. The test socket of claim 12, wherein a proportion of the plurality of conductive particles to the conductive elastic sheet is greater than or equal to 30% and less than or equal to 90%.

15. The test socket of claim 1, further comprising another conductive elastic sheet located below the second surface of the base.

16. The test socket of claim 1, wherein the conductive elastic sheet has a first contact surface and a second contact surface opposing the first contact surface, wherein the conductive elastic sheet is disposed on the base with the first contact surface facing the first surface, and the second contact surface corresponding to each of the elastic metal members has a plurality of convex pads protruding from the second contact surface.

17. The test socket of claim 1, wherein the conductive elastic sheet covers the first surface of the base and seals the through hole.

18. The test socket of claim 1, wherein the conductive elastic sheet comprises a substrate with a plurality of conductive elastic regions and a plurality of conductive particles distributed in the conductive elastic regions, and at least one of the conductive elastic regions corresponds to at least two of the elastic metal members.

19. The test socket of claim 1, further comprising a conductive member, wherein the conductive elastic sheet comprises a substrate with a plurality of conductive elastic regions corresponding to the elastic metal members respectively and a plurality of conductive particles distributed in the conductive elastic regions, wherein at least two of the conductive elastic regions are electrically connected by the conductive member.

20. The test socket of claim 19, wherein the elastic metal member is a ground probe or a power probe.

21. The test socket of claim 1, wherein the conductive elastic sheet is disposed with a support body on a peripheral side thereof, and the conductive elastic sheet is disposed on the base by the support body, so that there is a gap between the conductive elastic sheet and the first surface or the second surface, such that both ends of each of the elastic metal members are respectively protruded from the first surface and the second surface of the base and in contact with the conductive elastic sheet.

22. The test socket of claim 1, wherein when the bump of the elastic metal member stabs into a lower surface of the conductive elastic sheet and is inserted in the conductive elastic sheet, a distance between a top end of the bump and an upper surface of the conductive elastic sheet is less than 0.35 mm, or a proportion of the distance between the top end of the bump and the upper surface of the conductive elastic sheet to a thickness of the conductive elastic sheet is less than 85%.

23. A test socket, comprising:

a base having a first surface, a second surface opposing the first surface, and a plurality of through holes connecting the first surface and the second surface;

a plurality of elastic metal members respectively disposed in the plurality of through holes; and a conductive elastic sheet located above the base and the plurality of elastic metal members and having a thickness of less than or equal to 2 mm, wherein the base further comprises a frame body disposed on a peripheral side of the conductive elastic sheet and having a fluid inlet and a fluid outlet, wherein the conductive elastic sheet is disposed on the first surface of the base and seals the through hole, and the frame body and upper side surface of the conductive elastic sheet define a fluid space in communication with the fluid inlet and the fluid outlet.

24. The test socket of claim 23, wherein the thickness of the conductive elastic sheet is less than or equal to 0.4 mm.

25. The test socket of claim 23, wherein the elastic metal member has a first contact end facing the conductive elastic sheet, wherein the first contact end comprises a bump suitable for stabbing into a surface of the conductive elastic sheet, and the bump is able to insert into an interior of the conductive elastic sheet.

26. The test socket of claim 25, wherein the bump is in plural and pointed.

27. The test socket of claim 25, wherein a length of the bump is greater than or equal to 0.01 mm and less than the thickness of the conductive elastic sheet.

28. The test socket of claim 23, wherein the base is a metal base body, and the conductive elastic sheet comprises a plurality of conductive elastic regions corresponding to the elastic metal members respectively and a plurality of conductive particles distributed in the conductive elastic regions, wherein a width of the conductive elastic region is larger than a diameter of the through hole, such that the conductive elastic region is in contact with the base.

29. The test socket of claim 23, wherein the thickness of the conductive elastic sheet is greater than or equal to 0.15 mm and less than or equal to 0.4 mm.

30. The test socket of claim 23, wherein the conductive elastic sheet comprises a substrate and a plurality of conductive particles distributed in the substrate.

31. The test socket of claim 23, further comprising a conductive member, wherein the conductive elastic sheet comprises a substrate with a plurality of conductive elastic regions corresponding to the elastic metal members respectively and a plurality of conductive particles distributed in the conductive elastic region, wherein at least two of the conductive elastic regions are electrically connected by the conductive member.

32. A test socket, comprising:
a base;
a conductive elastic sheet located on the base; and
a plurality of elastic metal members disposed in the base,
    wherein a contact resistance between the elastic metal members and the conductive elastic sheet when the elastic metal members are inserted in the conductive elastic sheet is smaller than a contact resistance when the elastic metal members directly contact on conductive blocks of a device under test,
    wherein the base comprises a first surface, a second surface opposing the first surface, and a plurality of through holes connecting the first surface and the second surface, wherein the first surface is used for disposing the conductive elastic sheet, and the through hole is used for disposing the elastic metal member,
    wherein the base further comprises a frame body disposed on a peripheral side of the conductive elastic sheet and having a fluid inlet and a fluid outlet, wherein the conductive elastic sheet is disposed on the first surface of the base and seals the through hole, and the frame body and upper side surface of the conductive elastic sheet define a fluid space in communication with the fluid inlet and the fluid outlet.

33. The test socket of claim 32, wherein the elastic metal member has a first contact end facing the conductive elastic sheet, and the first contact end comprises a bump suitable for inserting in the conductive elastic sheet.

34. The test socket of claim 33, wherein the bump of the elastic metal members is suitable for stabbing into a surface of the conductive elastic sheet so as to be inserted into an interior of the conductive elastic sheet.

35. The test socket of claim 33, wherein the bump of the elastic metal member is in plural and pointed.

36. The test socket of claim 33, wherein a length of the bump is greater than or equal to 0.01 mm and less than a thickness of the conductive elastic sheet.

37. The test socket of claim 32, wherein the conductive elastic sheet comprises a substrate and a plurality of conductive particles distributed in the substrate.

38. The test socket of claim 32, wherein a thickness of the conductive elastic sheet is less than or equal to 0.4 mm.

39. A test socket, comprising:
a metal base having a first surface and a second surface opposing the first surface and a plurality of through holes communicating the first surface and the second surface;
a plurality of elastic metal members disposed in the plurality of through holes respectively and forming a coaxial structure with the metal base; and
a conductive elastic sheet located over the first surface of the metal base and suitable for contacting the elastic metal member,
    wherein the metal base further comprises a frame body disposed on a peripheral side of the conductive elastic sheet and having a fluid inlet and a fluid outlet, wherein the frame body and upper side surface of the conductive elastic sheet define a fluid space in communication with the fluid inlet and the fluid outlet and suitable for fluid flow.

40. The test socket of claim 39, wherein the elastic metal member has a bump suitable for stabbing into a surface of the conductive elastic sheet so as to be inserted into an interior of the conductive elastic sheet.

41. The test socket of claim 40, wherein the conductive elastic sheet is disposed on a frame base of the metal base and spaced an interval distance apart from the bumps of the elastic metal members.

42. The test socket of claim 39, wherein the elastic metal member is a ground probe and is connected to the metal base.

43. The test socket of claim 39, further comprising a conductive member, wherein the conductive elastic sheet comprises a substrate with a plurality of conductive elastic regions corresponding to the elastic metal members respectively and a plurality of conductive particles distributed in the conductive elastic region, wherein at least two of the conductive elastic regions are electrically connected by the conductive member.

44. The test socket of claim 43, wherein a width of the conductive elastic region is larger than a diameter of the through hole, such that the conductive elastic region is in contact with the metal base.

45. The test socket of claim 39, further comprising another conductive elastic sheet located below the second surface of the metal base.

46. The test socket of claim 45, wherein sidewall of the through hole is a continuous surface, and the continuous surface substantively has a constant distance from side surface of the elastic metal member disposed in the through hole.

* * * * *